(12) United States Patent
Tanaka et al.

(10) Patent No.: US 10,352,731 B2
(45) Date of Patent: Jul. 16, 2019

(54) TOUCH SENSING CIRCUIT AND SEMICONDUCTOR DEVICE

(71) Applicant: SYNAPTICS INCORPORATED, San Jose, CA (US)

(72) Inventors: Nobukazu Tanaka, Tokyo (JP); Takayuki Noto, Tokyo (JP); Tetsuo Tanemura, Yokohama (JP)

(73) Assignee: SYNAPTICS INCORPORATED, San Jose, CA (US)

( * ) Notice: Subject to any disclaimer, the term of this patent is extended or adjusted under 35 U.S.C. 154(b) by 61 days.

(21) Appl. No.: 15/467,332

(22) Filed: Mar. 23, 2017

(65) Prior Publication Data

US 2017/0343386 A1 Nov. 30, 2017

(30) Foreign Application Priority Data

May 30, 2016 (JP) ................. 2016-107263

(51) Int. Cl.
| | |
|---|---|
| *G01D 5/24* | (2006.01) |
| *G01R 27/26* | (2006.01) |
| *G06F 3/041* | (2006.01) |
| *G06F 3/044* | (2006.01) |
| *H03K 17/955* | (2006.01) |

(52) U.S. Cl.
CPC ........... *G01D 5/24* (2013.01); *G01R 27/2605* (2013.01); *G06F 3/044* (2013.01); *G06F 3/0416* (2013.01); *H03K 17/955* (2013.01); *H03K 2217/960735* (2013.01)

(58) Field of Classification Search
CPC ..... G06F 3/0416; G06F 3/044; H03K 17/955; G01R 27/2605; G01D 5/24
See application file for complete search history.

(56) References Cited

U.S. PATENT DOCUMENTS

| | | | | |
|---|---|---|---|---|
| 5,241,124 A | * | 8/1993 | Adachi | ............... G10H 1/055 84/607 |
| 9,753,586 B2 | * | 9/2017 | Marino | ............... G06F 3/044 |
| 2010/0295715 A1 | | 11/2010 | Sornin et al. | |
| 2013/0044073 A1 | * | 2/2013 | Christiansson | ..... G06F 3/0421 345/173 |
| 2014/0146010 A1 | | 5/2014 | Akai et al. | |

* cited by examiner

*Primary Examiner* — Bryan Bui
(74) *Attorney, Agent, or Firm* — Patterson + Sheridan, LLP

(57) ABSTRACT

A touch sensing circuit operable to sense a conductor approaching a sensor capacitance by measuring a response signal obtained from the sensor capacitance according to an applied detection signal includes an A/D converter and a Fourier transform device. The A/D converter samples the response signal with a predetermined cycle, followed by conversion to a digital value and outputs as time-series response data. The Fourier transform device calculates, from the time-series response data, a result of transformation at a detection frequency representing the reciprocal of a cycle of the detection signal and outputs it. The touch sensing circuit converts the response signal to the frequency domain, calculates only components (harmonics or others as needed) of a frequency equal to that of the detection signal required for touch sensing, and supplies them for a touch coordinate calculation process in a subsequent stage.

20 Claims, 14 Drawing Sheets

TOUCH SENSING CIRCUIT AND SEMICONDUCTOR DEVICE

CROSS-REFERENCE TO RELATED APPLICATIONS

The present application claims priority to Japanese application JP 2016-107263 filed on May 30, 2016, the content of which is hereby incorporated by reference into this application in its entirety.

BACKGROUND

The present disclosure relates to a touch sensing circuit and a semiconductor device including the same, especially those which can be suitably used for touch sensing arranged to sense the approach of a conductor to a sensor capacitance by measuring a response signal obtained from the sensor capacitance according to a detection signal applied thereto.

Touch sensing methods of a capacitance type are classified into a self-capacitance type method and a mutual capacitance type method. In any method, the presence or absence of a touch is detected by applying a predetermined detection signal to a sensor capacitance, charging or discharging a sensor capacitance and a capacitance component decreased or increased by touching, and receiving and measuring a response signal resulting therefrom.

A mutual capacitance type touch sensing circuit is disclosed by the Japanese Unexamined Patent Application Publication No. JP-A-2014-106864, in which a detection signal is assumed to be a rectangular wave, and a response signal corresponding to a rising edge thereof, and a response signal corresponding to the falling edge are integrated after mutual polarity inversion, whereby the sensitivity of detection is increased.

The U.S. Patent Application Publication No. 2010/0295715 discloses a delta-sigma ($\Delta\Sigma$) modulation circuit including, in its input part, a plurality of capacitances with a plurality of switches, smoothing an input signal. In the modulation circuit, the feedback control of the switches is performed so as to make a DC component of the input signal zero, thereby reducing an error owing to the clock jitter.

In JP-A-2014-106864, there is enough time in the timing of inverting the polarity of a response signal in the case of using a rectangular wave as the detection signal; and in the case of using, as the detection signal, a sine wave, a triangular wave or the like, there is not enough time in the timing of inverting the polarity of a response signal. In case that there is not enough time in the timing of inverting the polarity of a response signal, a response signal which is originally on the positive side can be integrated as a response signal on the negative side or vice versa. As a result, the detection or sensing accuracy cannot be maintained. Specifically, there is the problem that a phase noise component superimposed on a response signal worsens the sensing accuracy.

To solve the problem, a technique described in U.S. Patent Application Publication No. 2010/0295715 may be combined. Specifically, the timing of inverting the polarity of a response signal can be kept at an appropriate timing by providing a plurality of capacitances with respective switches in the response signal input part, and performing the feedback control of the switches so as to make a DC component of the response signal zero.

However, the solving means like this has the problem that the necessity for providing a plurality of capacitances and switches leads to the increases in circuit scale. Especially, for a touch sensing circuit, many sensor capacitances are mounted thereon because of the need for increasing the sensing accuracy of touch coordinates and accordingly, there is a tendency to mount many touch sensing circuits. So, the increase in circuit scale becomes a serious problem.

SUMMARY

It is one object of the disclosure to prevent a phase noise superimposed on a response signal from worsening the sensing accuracy while suppressing the increase in circuit scale. While means for solving the above problems are described below, other problems and novel features of the disclosure will become apparent from the description hereof and the accompanying diagrams.

According to one embodiment, a touch sensing circuit is operable to sense the approach of a conductor to a sensor capacitance by measuring a response signal obtained from the sensor capacitance according to a detection signal applied thereto. The touch sensing circuit includes an analog-to-digital converter and a Fourier transform device. The analog-to-digital converter samples a response signal with a predetermined cycle, converts the sampled response signal to a digital value, and outputs the digital value as time-series response data. The Fourier transform device calculates, from the time-series response data, an amplitude value at a detection frequency which is a reciprocal of the cycle of the detection signal and outputs the amplitude value.

Using the embodiment, it is possible to prevent the worsening of the sensing accuracy owing to phase noise superimposed on response signals while suppressing the increase in circuit scale. The touch sensing circuit converts response signals to a frequency domain, calculates only a component of a frequency equal to the frequency of detection signals required for touch sensing, and provides it for a touch coordinate calculation process in a subsequent stage. Therefore, the touch sensing circuit is small in circuit scale, and enables the elimination of the influence of phase noise.

DETAILED DESCRIPTION

1. Summary of the Embodiments

Figure 1:
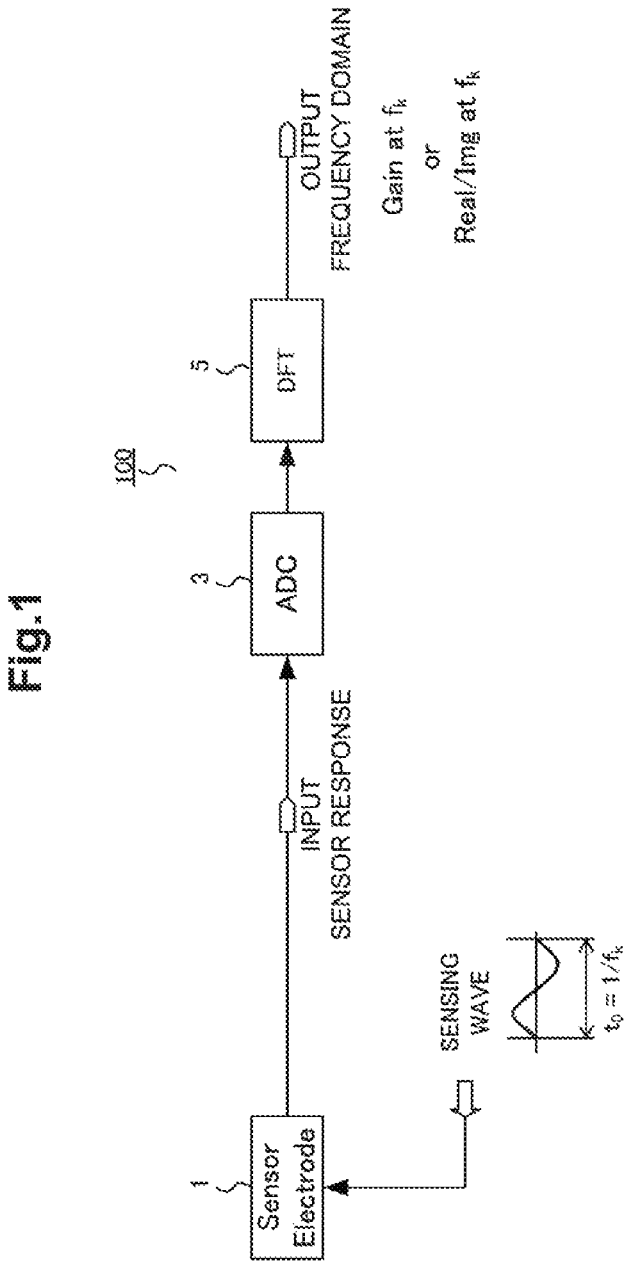
FIG. 1 is a block diagram showing an example of the basic arrangement of a touch sensing circuit according to the disclosure.

The representative embodiments disclosed in the present application will be outlined first. Here, the reference numerals and character strings for reference to the diagrams, which are accompanied with paired round brackets, only exemplify what the concepts of members or components referred to by the numerals or character strings contain.

[1] Touch Sensing Circuit Operable to Perform a Fourier Transform of Detection Signals into the Frequency Domain A touch sensing circuit (100) which senses a conductor approaching a sensor capacitance (1) by measuring a response signal (SENSOR RESPONSE) obtained from the sensor capacitance according to a detection signal (SENSING WAVE) applied thereto is arranged as follows.

The touch sensing circuit includes an analog-to-digital converter (ADC; 3) and a Fourier transform device (DFT; 5).

The analog-to-digital converter samples the response signal with a predetermined cycle, converts the sampled signals to digital values, and outputs them as time-series response data.

The Fourier transform device calculates, from the time-series response data, a result of the transformation at a detection frequency (fk) which is a reciprocal of the cycle (t0) of the detection signal (Gain at fk or Real/Img at fk), and outputs it.

According to this embodiment, the phase noise superimposed on a response signal can be prevented from worsening the sensing accuracy while suppressing the increase in circuit scale.

[2] Arbitrary Waveform Generator+Fourier Coefficient Generator (the Sharing of a Coefficient Table)

The touch sensing circuit as described in [1] further includes a timer (10), an arbitrary waveform generator (DDS; 6), a digital-to-analog converter (DAC; 7), and a Fourier coefficient generator (8) having a coefficient table (81 to 84).

The timer supplies the arbitrary waveform generator and the Fourier coefficient generator with a common timing signal.

The coefficient table holds a coefficient sequence for producing Fourier coefficients.

The Fourier coefficient generator sequentially reads each coefficient sequence (data_img and data_real) from the coefficient table based on the timing signal, and supplies the Fourier transform device and the arbitrary waveform generator therewith.

The Fourier coefficient generator produces Fourier coefficients (coef_data_img and coef_data_real) based on the supplied coefficient sequence and supplies the Fourier transform device therewith.

The arbitrary waveform generator produces time-series data (data_dds_img) based on the supplied coefficient sequence, and the digital-to-analog converter converts the time-series data into an analog signal, and outputs the analog signal as the detection signal.

According to this embodiment, the necessity for the arbitrary waveform generator (DDS; 6) to have a waveform table is eliminated in case that the waveform of the detection signal is made a sine or cosine wave. Therefore, even with a small circuit scale, the coefficient generator (8) is allowed to supply Fourier transform coefficients at a detection frequency to the Fourier transform device, and the arbitrary waveform generator (DDS; 6) is allowed to supply time-series data of the detection signal.

[3] Coefficient Table that Holds a Data Sequence of a Quarter Cycle of Sin or Cos In the touch sensing circuit as described in [1] or [2], the coefficient table holds a data sequence of a quarter cycle of a sine or cosine wave as the coefficient sequence.

According to this embodiment, the arbitrary waveform generator (DDS; 6) and the coefficient generator (8) can be arranged with smaller circuit scale.

[4] Window Function that is Further Included

The touch sensing circuit as described in [1], [2] or [3] further includes a window function generator (9).

The timer further supplies the timing signal to the window function generator, and the window function generator supplies coefficient values of a window function to the Fourier coefficient generator based on the timing signal.

The Fourier coefficient generator produces Fourier coefficients based on the supplied coefficient sequence and the coefficient values of the window function, and supplies the Fourier coefficients to the Fourier transform device.

According to this embodiment, a window function is applied to the Fourier transform, which enables the reduction in transform error in the frequency domain owing to time-series data being finite, and enables the increase in resistance against extraneous noise.

[5] Arbitrary Waveform Generator+Fourier Coefficient Generator (Waveform Table and Coefficient Table)

The touch sensing circuit as described in [1] further includes a timer (10), an arbitrary waveform generator (DDS; 6) having a waveform table (61), a digital-to-analog converter (DAC; 7), and a Fourier coefficient generator (8) having a coefficient table (81).

The timer supplies the arbitrary waveform generator and the Fourier coefficient generator with a common timing signal.

The waveform table holds time-series data for producing the detection signal, the arbitrary waveform generator sequentially reads the time-series data from the waveform table based on the timing signal, and supplies the time-series data to the digital-to-analog converter. The digital-to-analog converter converts the sequentially supplied time-series data into an analog signal, and outputs the analog signal as the detection signal.

The coefficient table holds a coefficient sequence for producing Fourier coefficients, and the Fourier coefficient generator sequentially reads the coefficient sequence from the coefficient table based on the timing signal, produces Fourier coefficients, and supplies the Fourier transform device therewith.

According to this embodiment, Fourier transform coefficients at the detection frequency can be supplied to the Fourier transform device in case that the waveform of a detection signal is an arbitrary waveform other than sine wave.

[6] Time-Series Data of a Quarter Cycle

In the touch sensing circuit as described in [5], the waveform table holds time-series data of a quarter cycle of the detection signal, and the coefficient table holds a data sequence of a quarter cycle of a sine or cosine wave as the coefficient sequence.

According to this embodiment, the arbitrary waveform generator can be arranged with smaller circuit scale.

[7] Window Function that is Further Included

The touch sensing circuit as described in [5] or [6] further includes a window function generator (9).

The timer further supplies the timing signal to the window function generator.

The window function generator supplies the Fourier coefficient generator with coefficient values of a window function based on the timing signal, and the Fourier coefficient generator produces Fourier coefficients based on the sequentially supplied coefficient sequence and the coefficient values of the window function, and supplies the Fourier transform device therewith.

According to this embodiment, a window function is applied to the Fourier transform, which enables the reduction in transform error in the frequency domain owing to time-series data being finite, and enables the increase in resistance against extraneous noise.

[8] Analog-to-Digital Converter of ΣΔ Type

In the touch sensing circuit as described in any one item of [1] to [7], the analog-to-digital converter is sigma-delta type one.

According to this embodiment, the increase in circuit scale can be suppressed.

[9] 1-Bit ΣΔ Modulator+Multiplication by XNOR(XOR)

In the touch sensing circuit as described in [2] or [5], the analog-to-digital converter is a 1-bit sigma-delta modulation circuit (4).

The Fourier transform device accumulatively adds up the Fourier coefficients sequentially supplied from the Fourier coefficient generator after having inverted the Fourier coefficients in sign or otherwise as they are according to a result of exclusive-OR (35, 36) of a sign bit of each Fourier coefficient, and an output from the sigma-delta modulation circuit, thereby calculating a result of the transformation (dft_real and dft_img) at the detection frequency.

According to this embodiment, the increase in circuit scale can be suppressed further.

[10] Semiconductor Device

A semiconductor device (201, 202) is connectable to a sensor capacitance (1), and includes a touch sensing circuit (100) operable to sense a conductor approaching a sensor capacitance by measuring a response signal (SENSOR RESPONSE) obtained from the sensor capacitance according to a detection signal (SENSING WAVE) applied to the sensor capacitance. The semiconductor device is arranged as follows.

The touch sensing circuit (100) includes an analog-to-digital converter (ADC; 3) and a Fourier transform device (DFT; 5).

The analog-to-digital converter samples the response signal with a predetermined cycle, converts the sampled response signals into digital values, and outputs them as time-series response data.

The Fourier transform device calculates, from the time-series response data, a result of transformation at a detection frequency (fk) (Gain at fk or Real/Img at fk) which is a reciprocal of the cycle (t0) of the detection signal, and outputs the result.

According to this embodiment, it becomes possible to provide a semiconductor device, e.g. a touch controller IC, which can prevent the phase noise superimposed on a response signal from worsening the sensing accuracy while suppressing the increase in circuit scale.

[11] Arbitrary Waveform Generator+Fourier Coefficient Generator (Sharing a Coefficient Table)

In the semiconductor device as described in [10], the touch sensing circuit further includes a timer (10), an arbitrary waveform generator (DDS; 6), a digital-to-analog converter (DAC; 7), and a Fourier coefficient generator (8) having a coefficient table (81 to 84).

The timer supplies the arbitrary waveform generator and the Fourier coefficient generator with a common timing signal.

The coefficient table holds a coefficient sequence for producing Fourier coefficients.

The Fourier coefficient generator sequentially reads each coefficient sequence (data_img, data_real) from the coefficient table based on the timing signal, and supplies the Fourier transform device and the arbitrary waveform generator therewith.

The Fourier coefficient generator produces Fourier coefficients (coef_data_img, coef_data_real) based on the supplied coefficient sequence, and supplies the Fourier transform device therewith.

The arbitrary waveform generator produces time-series data (data_dds_img) based on the supplied coefficient sequence, and the digital-to-analog converter converts the time-series data into an analog signal and outputs the analog signal as the detection signal.

According to this embodiment, the necessity for the arbitrary waveform generator (DDS; 6) to have a waveform table is eliminated in case that the waveform of the detection signal is made a sine or cosine wave. Therefore, even with a small circuit scale, the coefficient generator (8) is allowed to supply Fourier transform coefficients at a detection frequency to the Fourier transform device, and the arbitrary waveform generator (DDS; 6) is allowed to supply time-series data of the detection signal.

[12] Coefficient Table that Holds a Data Sequence of a Quarter Cycle of Sin or Cos In the semiconductor device as described in [10] or [11], the coefficient table holds a data sequence of a quarter cycle of a sine or cosine wave as the coefficient sequence.

According to this embodiment, the arbitrary waveform generator (DDS; 6) and the coefficient generator (8) can be arranged with smaller circuit scale.

[13] Window Function that is Further Included

The touch sensing circuit as described in [10], [11] or [12] further includes a window function generator (9).

The timer further supplies the timing signal to the window function generator, and the window function generator supplies coefficient values of a window function to the Fourier coefficient generator based on the timing signal.

The Fourier coefficient generator produces Fourier coefficients based on the supplied coefficient sequence and the coefficient values of the window function, and supplies the Fourier transform device therewith.

According to this embodiment, a window function is applied to the Fourier transform, which enables the reduction in transform error in the frequency domain owing to time-series data being finite, and enables the increase in resistance against extraneous noise.

[14] Arbitrary Waveform Generator+Fourier Coefficient Generator (Waveform Table and Coefficient Table)

In the semiconductor device as described in [10], the touch sensing circuit further includes a timer (10), an arbitrary waveform generator (DDS; 6) having a waveform table (61), a digital-to-analog converter (DAC; 7), and a Fourier coefficient generator (8) having a coefficient table (81).

The timer supplies the arbitrary waveform generator and the Fourier coefficient generator with a common timing signal.

The waveform table holds time-series data for producing the detection signal, and the arbitrary waveform generator sequentially reads the time-series data from the waveform table based on the timing signal, and supplies the digital-to-analog converter therewith. The digital-to-analog converter converts the sequentially supplied time-series data into an analog signal, and outputs the analog signal as the detection signal.

The coefficient table holds a coefficient sequence for producing Fourier coefficients, and the Fourier coefficient generator sequentially reads the coefficient sequence from the coefficient table based on the timing signal, produces Fourier coefficients and supplies the Fourier transform device therewith.

According to this embodiment, Fourier transform coefficients at the detection frequency can be supplied to the Fourier transform device in case that the waveform of a detection signal is an arbitrary waveform other than sine wave.

[15] Time-Series Data of a Quarter Cycle

In the semiconductor device as described in [14], the waveform table holds time-series data of a quarter cycle of the detection signal, and the coefficient table holds a data sequence of a quarter cycle of a sine or cosine wave as the coefficient sequence.

According to this embodiment, the arbitrary waveform generator can be arranged with smaller circuit scale.

[16] Window Function that is Further Included

In the semiconductor device as described in [14] or [15], the touch sensing circuit further includes a window function generator (9).

The timer further supplies the timing signal to the window function generator.

The window function generator supplies the Fourier coefficient generator with coefficient values of a window function based on the timing signal, and the Fourier coefficient generator produces Fourier coefficients based on the sequentially supplied coefficient sequence and the coefficient values of the window function, and supplies the Fourier transform device therewith.

According to this embodiment, a window function is applied to the Fourier transform, which enables the reduction in transform error in the frequency domain owing to time-series data being finite, and enables the increase in resistance against extraneous noise.

[17] Analog-to-Digital Converter of $\Sigma\Delta$ Type

In the semiconductor device as described in any one item of [10] to [16], the analog-to-digital converter is sigma-delta type one.

According to this embodiment, the increase in circuit scale can be suppressed.

[18] 1-Bit $\Sigma\Delta$ Modulator+Multiplication by XNOR(XOR)

In the semiconductor device as described in [11] or [14], the analog-to-digital converter is a 1-bit sigma-delta modulation circuit (4).

The Fourier transform device accumulatively adds up the Fourier coefficients sequentially supplied from the Fourier coefficient generator after having inverted the Fourier coefficients in sign or otherwise as they are according to a result of exclusive-OR (35, 36) of a sign bit of each Fourier coefficient, and an output from the sigma-delta modulation circuit, thereby calculating a result of the transformation (dft_real and dft_img) at the detection frequency.

According to the embodiment like this, the increase in circuit scale can be suppressed further.

2. Detailed Description of the Embodiments

The embodiments will be described further in detail.

[First Embodiment] Touch Sensing Circuit Operable to Fourier-Transform a Detection Signal into a Frequency Domain FIG. 1 is a block diagram showing an example of the basic arrangement of a touch sensing circuit 100 according to the disclosure. The touch sensing circuit 100 measures the fluctuation of a capacitance value of a sensor capacitance (also, referred to as "sensor node") 1 in order to sense the approach of a conductor such as a finger of a user to the sensor capacitance 1 by measuring a response signal (SENSOR RESPONSE) obtained from the sensor capacitance 1 according to a detection signal (SENSING WAVE) applied thereto. While the signal shown in FIG. 1 is a digital signal of one to multiple bits for one or more lines, the bus notation is omitted. This applies to other embodiments disclosed in the present application and to another block diagram or the like to which reference is made.

Figure 12:
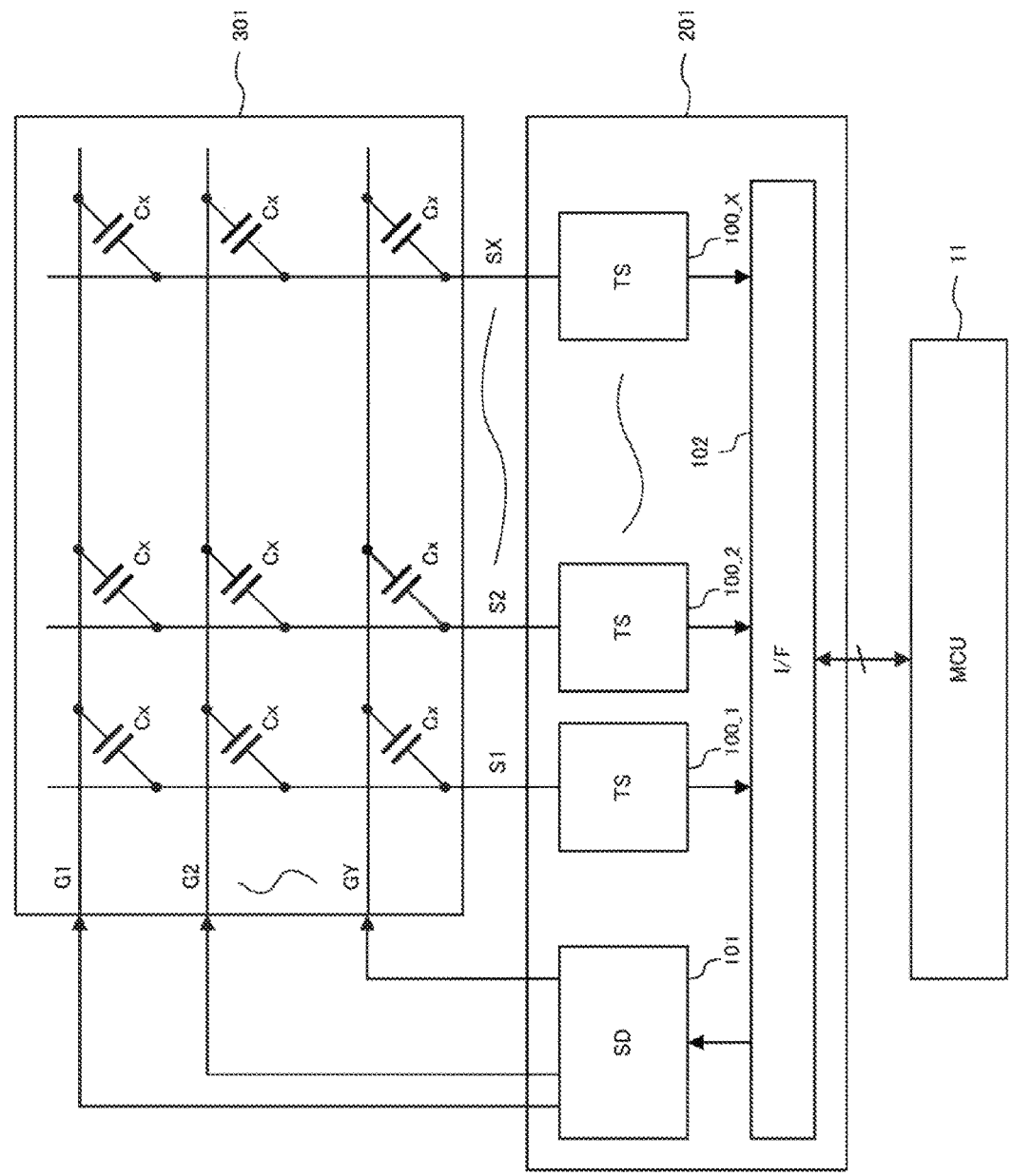
FIG. 12 is a block diagram schematically showing an example of the arrangement of a mutual capacitance type touch panel and a touch controller.
Figure 13:
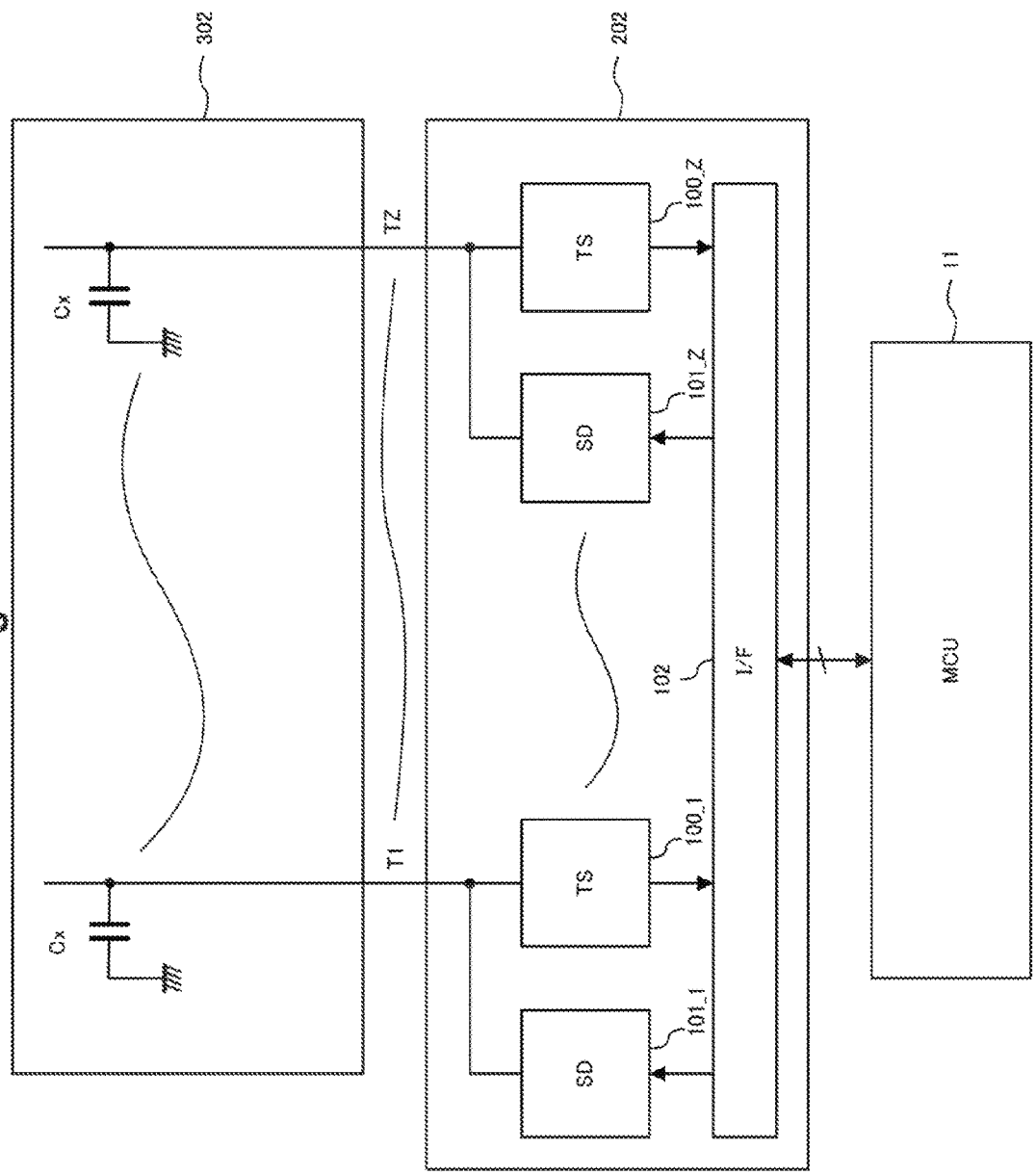
FIG. 13 is a block diagram schematically showing an example of the arrangement of a self-capacitance type touch panel and a touch controller.

FIGS. 12 and 13 are block diagrams schematically showing examples of the arrangement of mutual capacitance type and self-capacitance type touch panels, and a touch controller.

In the touch panel 301 of the mutual capacitance type (FIG. 12), capacitances Cx representing the sensor capacitances 1 are disposed at positions where detection signal lines G1 to GY cross response signal lines S1 to SX like a matrix. The touch controller IC (Integrated Circuit) 201 includes: a detection signal drive circuit (SD) 101 for driving the detection signal lines G1 to GY; touch sensing circuits (TS) 100_1 to 100_X connected to the response signal lines S1 to SX respectively; and an interface (I/F) 102. The microcontroller (MCU) 11 connected through the interface (I/F) 102 controls the touch controller IC 201 and, determines a touch coordinate from a change in capacitance value of the sensor capacitance (Cx) 1, which is observed by the touch sensing circuits 100_1 to 100_X. In the mutual capacitance type touch panel, charge/discharge currents arise on the response signal lines S1 to SX according to capacitance values of the sensor capacitances (Cx) 1 as the detection signal lines G1 to GY are driven sequentially; the current values are measured by the touch sensing circuits 100_1 to 100_X. The current value of each response signal is increased or decreased corresponding to the change in the capacitance value of the sensor capacitance (Cx) 1 and as such, the decrease in the capacitance value of the sensor capacitance (Cx) 1 owing to the approach of a conductor such as a finger of a user can be sensed.

In the self-capacitance type touch panel 302 (FIG. 13), a detection signal is applied to a capacitance Cx representing the sensor capacitance 1 and disposed to each line T1 to TZ on which a response signal arises. The touch controller IC 202 includes: combinations of detection signal drive circuits (SD) 101_1 to Z and touch sensing circuits 100_1 to 100_Z, which are connected to the lines T1 to TZ respectively; and an interface (I/F) 102. The microcontroller (MCU) 11 connected through the interface (I/F) 102 controls the touch controller IC 202, and determines touch coordinates from changes of capacitance values of the sensor capacitances (Cx) 1 observed by the touch sensing circuits 100_1 to 100_Z. In the self-capacitance type touch panel, discharge currents arise on the lines T1 to TZ according to the capacitance values of the sensor capacitances (Cx) 1 as the detection signal drive circuits (SD) 101_1 to Z charge the sensor capacitances (Cx) 1 through the lines T1 to TZ. The touch sensing circuits 100_1 to 100_Z measure the current values thereof. The current value of a response signal is increased or decreased according to the change in the capacitance value of the sensor capacitance (Cx) 1. So, the increase of the capacitance value of the sensor capacitance (Cx) 1 owing to the approach of a conductor such as a finger of a user can be sensed.

While the description has been made on the supposition that the number of the sensor capacitances (Cx) 1 is the same as that of the touch sensing circuits for the sake of simplicity, the touch sensing circuit may be arranged to work according to the time-sharing method by a multiplex or other means.

In the case of adopting a touch panel of either type, the touch sensing circuit 100 can sense the approach of a conductor such as a finger of a user to the sensor capacitance (Cx) 1 by measuring a response signal (SENSOR RESPONSE) obtained from the sensor capacitance (Cx) 1 according to a detection signal (SENSING WAVE) applied thereto.

Although no special restriction is intended, in the case of adopting a touch panel of either type, the touch controller IC 201 or 202 is formed on a single semiconductor substrate of silicon or the like by e.g. a known CMOS (Complementary Metal-Oxide-Semiconductor field effect transistor) LSI (Large Scale Integrated circuit) manufacturing technique. The touch controller IC may be integrated in a semiconductor chip in which the display driver circuit is arranged. The touch controller IC is mounted on a glass substrate of the display touch panel in a flip chip form, whereby the mounting/wiring area of the display touch panel can be decreased and therefore, contribution can be made to the achievement of a narrower frame.

Again, referring to FIG. 1, the sensor node 1 corresponds to the sensor capacitance (Cx) 1 in FIGS. 12 and 13. The touch sensing circuit 100 includes an analog-to-digital converter (ADC) 3 and a Fourier transform device (DFT) 5. The analog-to-digital converter 3 samples a response signal, converts the signal to a digital value, and outputs the resultant digital signal as time-series response data with a predetermined cycle. The Fourier transform device 5 calculates, from the time-series response data, a result of conversion at a detection frequency (fk) which is the reciprocal of the cycle (t0) of a detection signal, and outputs it. With a detection signal of a cycle t0 applied to the sensor node 1, the basic frequency fk of the response signal which reflects the change in the capacitance value of the sensor node 1 becomes 1/t0 which is the same as the basic frequency of the detection signal. The Fourier transform device 5 executes the discrete Fourier transform on the digitalized response signal, thereby converting the response signal into a signal of the frequency domain. Of response signals of the frequency domain, a component of the basic frequency fk most remarkably reflects the change in the capacitance value of the sensor node 1. A complex frequency component consisting of a combination of a real part Real and an imaginary part Img at the basic frequency fk, or an amplitude component (Gain) calculated therefrom is output.

Thus, phase noise superimposed on a response signal can be prevented from worsening the sensing accuracy while suppressing the increase in circuit scale.

While the embodiment has been described on the supposition that in signals of a frequency domain, a response signal has a basic frequency fk of 1/t0 which is the same as the basic frequency of the detection signal, the disclosure is not limited to the embodiment. The response signal may be, of signals of the frequency domain, a signal with a higher harmonic component of the basic frequency and further, it may be a signal of a frequency component different from the basic frequency.

Figure 14:
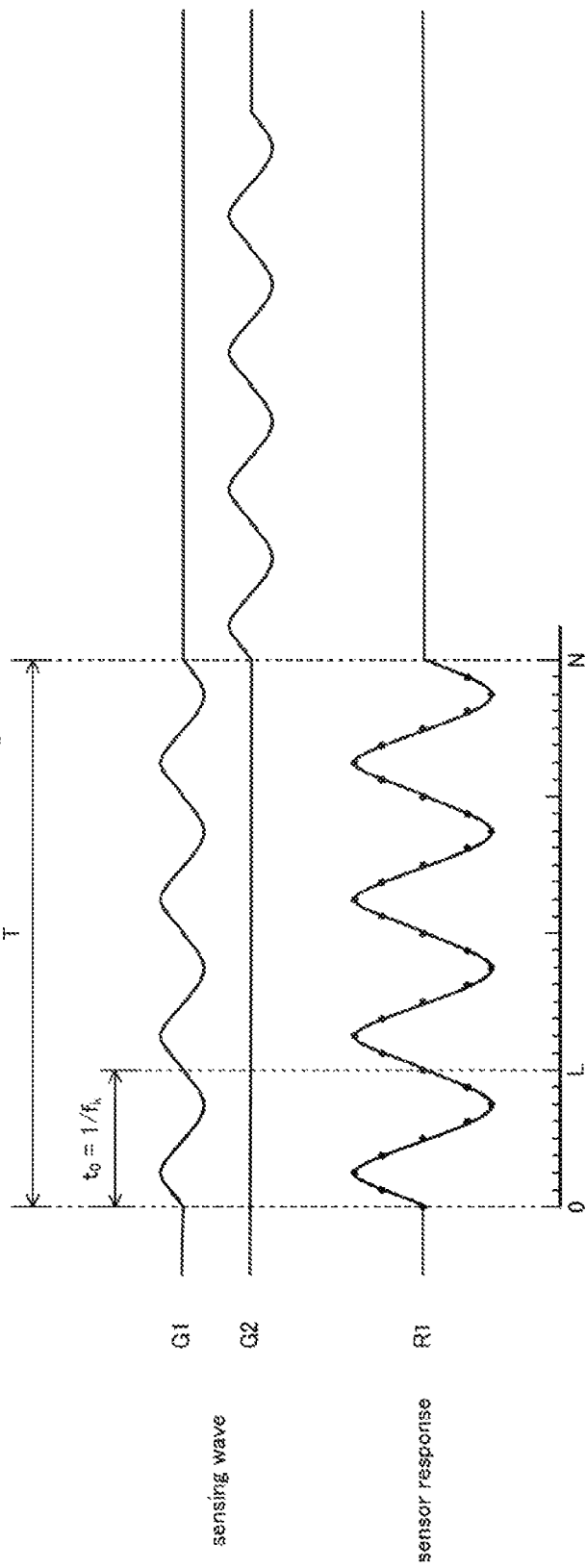
FIG. 14 is an explanatory diagram showing a basic action of the touch sensing circuit according to the disclosure.

FIG. 14 is an explanatory diagram showing a basic action of the touch sensing circuit 100 according to the disclosure. In the touch panel of the mutual capacitance type shown in FIG. 12, the detection signal (SENSING WAVE) is applied to the detection signal lines G1 to GY in turn. Turning to the detection signal G1, the signal with the cycle t0, i.e. the basic frequency fk=1/t0 is applied during only a predetermined period T as shown in the diagram. While the detection signal G1 arranged so that the period T includes four cycles of a sine wave is shown in FIG. 14, it is just an example. That is, the number of repetitions of a signal waveform included in the period T may be any number. The waveform is not limited to only a sine wave, cosine wave, and it may be any waveform of a trapezoidal wave, a rectangular wave, a triangular wave and the like. In this embodiment, the response signal (SENSOR RESPONSE) is a signal having the same basic frequency fk. The waveform of the detection signal may be adjusted so that the response signal becomes a sine or cosine wave rather than the detection signal.

The analog-to-digital converter (ADC) 3 samples response signals (SENSOR RESPONSE), converts them to digital values, and outputs time-series response data R(0) to R(N−1). This embodiment is described on the supposition that the sampling is performed N times during the period T. N Response data R(0) to R(N−1) of the time domain will be obtained, which are converted to the frequency domain by the discrete Fourier transform. Thus, the response signals F(0) to F(N−1) of the frequency domain are obtained.

Now, the basic transform formula of the discrete Fourier transform will be described below.

$$R(n) = \frac{1}{N}\sum_{k=0}^{N-1} F_k \exp\left(j - \frac{2\pi kn}{N}\right)$$

$$= \frac{1}{N}\sum_{k=0}^{N-1} a_k \cos\left(\frac{2\pi kn}{N}\right) + jb_k \sin\left(\frac{2\pi kn}{N}\right)$$

[Formula 1]

-continued $$F(f) = \sum_{n=0}^{N-1} R(n)\exp(-j2\pi fn) \quad \text{[Formula 2]}$$

$$= \sum_{n=0}^{N-1} R(n)\{\cos(2\pi fn) - j\sin(2\pi fn)\}$$

$$= R(0)\cos(0) + R(1)\cos(2\pi f) + R(2)\cos(4\pi f) +$$
$$R(3)\cos(6\pi f) + \ldots + R(N-1)\cos(2\pi(N-1)f) -$$
$$j\{R(0)\sin(0) + R(1)\sin(2\pi f) + R(2)\sin(4\pi f) +$$
$$R(3)\sin(6\pi f) + \ldots + R(N-1)\sin(2\pi(N-1)f)\}$$

$$F(fk) = R(0)\cos(0) + R(1)\cos\left(\frac{2\pi}{8}\right) + R(2)\cos\left(\frac{4\pi}{8}\right) + \quad \text{[Formula 3]}$$

$$R(3)\cos\left(\frac{6\pi}{8}\right) + \ldots + R(31)\cos\left(\frac{2\pi \times 31}{8}\right) -$$

$$j\left\{R(0)\sin(0) + R(1)\sin\left(\frac{2\pi}{8}\right) + R(2)\sin\left(\frac{4\pi}{8}\right) +\right.$$

$$\left. R(3)\sin\left(\frac{6\pi}{8}\right) + \ldots + R(31)\sin\left(\frac{2\pi \times 31}{8}\right)\right\}$$

The formula 1 is a transform expression showing the relation between signals F(0) to F(N−1) of the frequency domain and signals R(0) to R(N−1) of the time domain. The formula 2 is a transform expression resulting from the transformation into a form for calculating signals F(0) to F(N−1) of the frequency domain from signals R(0) to R(N−1) of the time domain by the rewrite thereof. Supposing that a length of time of a cycle T includes four cycles of a signal of a basic frequency fk=1/t0 as shown in FIG. 14 by example, the signal component F(fk) of the frequency fk in the frequency domain is expressed as given by the formula 3. By calculating only the components of the basic frequency fk rather than all of frequency components included in the response signal in this way, the amount of calculation can be reduced largely and the circuit scale can be suppressed further than that achieved in the case of mounting e.g. a fast Fourier transform circuit. Now, it is noted that what is calculated by the touch sensing circuit is not necessarily limited to only the components of the basic frequency fk, and it may include even second and third harmonic components, or modification may be made so as to calculate only other characteristic frequency components.

Figure 2:
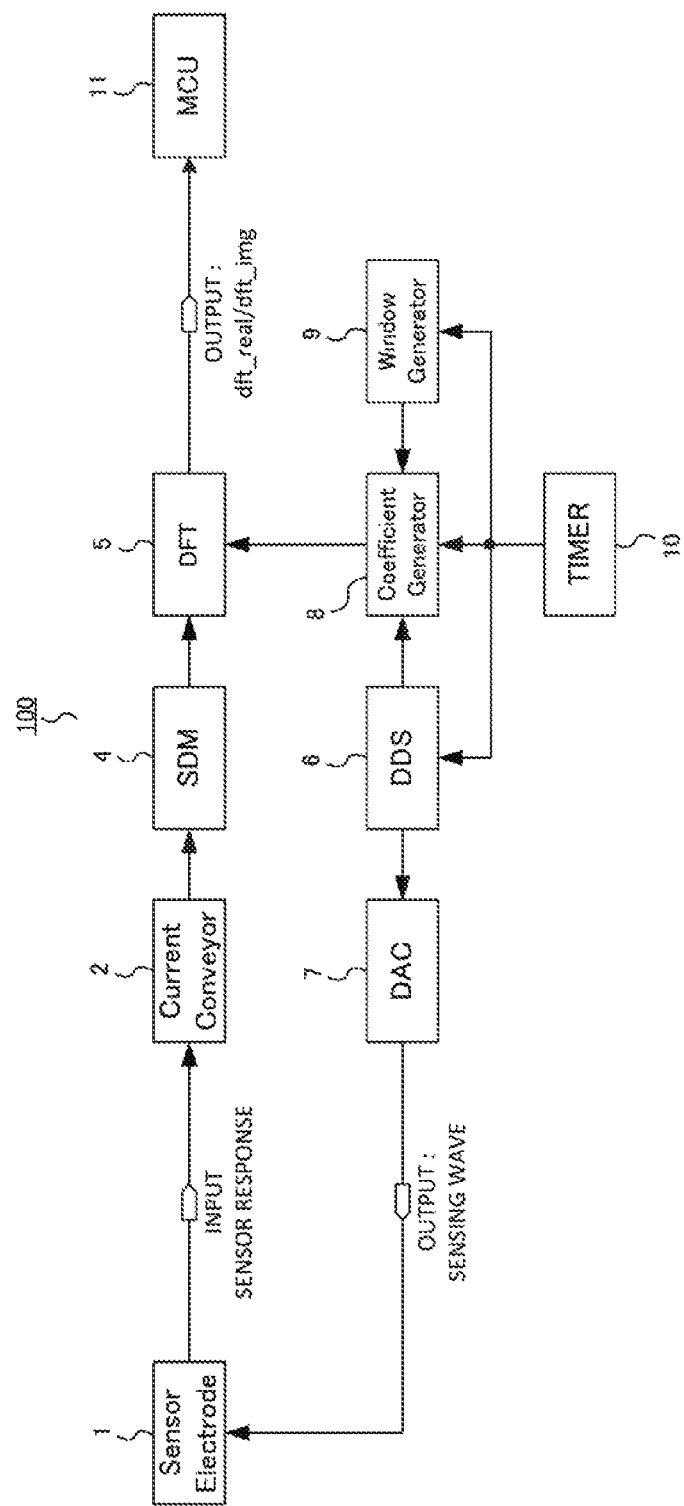
FIG. 2 is a block diagram showing an example of arrangement of the touch sensing circuit according to a second embodiment.

[Second Embodiment] Arbitrary Waveform Generator+Coefficient Generator+Window Function Generator FIG. 2 is a block diagram showing an example of arrangement of a touch sensing circuit 100 according to the second embodiment. The touch sensing circuit 100 includes a current-to-current converter (Current Conveyor) 2, a sigma-delta modulator (SDM: Sigma Delta Modulator) 4, a discrete Fourier transform device (DFT: Discrete Fourier Transfer) 5, an arbitrary waveform generator (DDS: Direct Digital Synthesizer) 6, a D/A converter (DAC: Digital to Analog Convertor) 7, a coefficient generator (Coefficient Generator) 8; and a timer (TIMER) 10, and is connected to the sensor node 1 and the microcomputer (MCU: Micro Controller Unit) 11.

The touch sensing circuit 100 in the second embodiment is characterized that a detection signal (SENSING WAVE) applied to the sensor node 1, and a Fourier coefficient supplied to the discrete Fourier transform device (DFT) 5 are produced and supplied in synchronization with a timer 10 common to them. The arbitrary waveform generator (DDS) 6 generates time-series data based on a timing signal supplied from the timer 10 and supplies the time-series data to the D/A converter 7. The D/A converter 7 converts the time-series data into analog detection signals, and applies the signals to the sensor node 1. Likewise, the coefficient generator 8 creates a Fourier coefficient based on a timing signal supplied from the timer 10 and supplies the Fourier coefficient to the discrete Fourier transform device 5.

The response signal (SENSOR RESPONSE) obtained from the sensor node 1 according to a detection signal (SENSING WAVE) applied thereto is passed through the current-to-current converter (Current Conveyor) 2, input to the sigma-delta modulator (SDM) 4, converted into discrete digital time-series data, and supplied to the discrete Fourier transform device (DFT) 5. The discrete Fourier transform device (DFT) 5 performs the convolution operation of time-series data sequentially supplied thereto with Fourier coefficients to determine a real number term dft_real and an imaginary number term dft_img of a frequency domain component and outputs to the microcomputer (MCU) 11. Alternatively, it may calculate a gain GAIN (i.e. an amplitude in the frequency domain) by RMS (Root Mean Square), i.e. the square root of the sum of respective squares of the real number term dft_real and the imaginary number term dft_img, and output to the microcomputer (MCU) 11.

The touch sensing circuit 100 may further include a window function generator (Window Generator) 9. The timer 10 supplies the timing signal to the window function generator 9 as well as the coefficient generator 8, and a window function coefficient is supplied to the coefficient generator 8 in synchronization with the timing signal. The coefficient generator 8 calculates a Fourier coefficient by the multiplication by each window function coefficient supplied thereto, which is supplied to the discrete Fourier transform device (DFT) 5. Thus, the worsening of spectra accuracy can be compensated owing to an input response signal being finite in its length.

While the touch sensing circuit of FIG. 2 has described on the supposition that the touch panel is mutual capacitance type one and the touch sensing circuit includes an output terminal for a detection signal and an input terminal for a response signal separately, the touch sensing circuit may be modified so that it can be connected to a self-capacitance type touch panel. A detection signal component is removed from the response signal (SENSOR RESPONSE) in such a way that a detection signal (SENSING WAVE) is input to the current-to-current converter (Current Conveyor) 2 from the D/A converter 7 to cancel out the detection signal component; and only a signal component reflecting the value of the remaining capacitance of the sensor node is input to the sigma-delta modulator (SDM) 4. The touch sensing circuit may include a current-voltage converter (Trans-Impedance Amplifier) instead of the current-to-current converter (Current Conveyor) 2. According to the embodiment like this, the touch sensing circuit can be arranged so that the sigma-delta modulator (SDM) 4 accepts a voltage input. Also, the touch sensing circuit may include a voltage-current converter (Trans-Conductance Amplifier) or a voltage-voltage converter (Voltage Convertor) instead of the current-to-current converter (Current Conveyor) 2, by which the response signal (SENSOR RESPONSE) can be made a voltage signal.

[Third Embodiment] Sharing of a Coefficient Memory

The arbitrary waveform generator (DDS) 6, the coefficient generator 8, and the window function generator 9 each include a memory operable to hold time-series data, and an address counter operable to perform the action of counting timing signals supplied from the timer 10, and they each produce time-series data by sequentially reading data from the memory according to an address supplied from the address counter.

[In the Case of Including a Waveform Memory and a Coefficient Memory]

Figure 3:
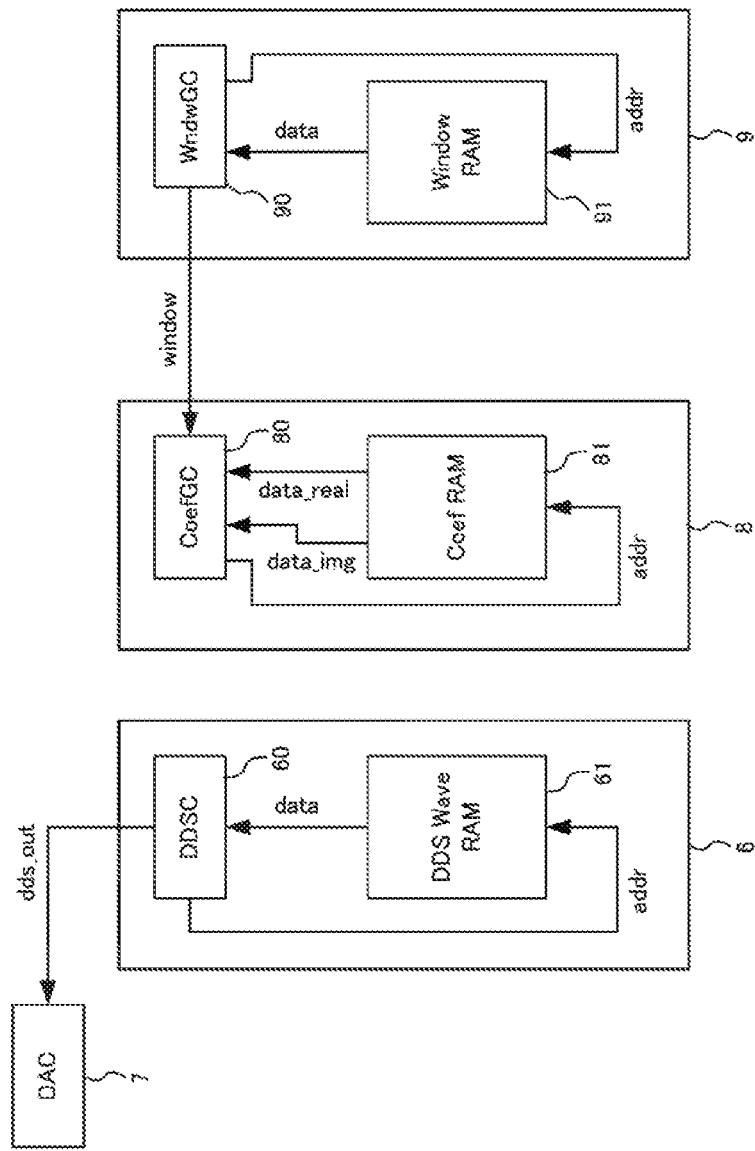
FIG. 3 is a block diagram showing an example of the arrangement in which a waveform memory (DDS Wave RAM) and a coefficient memory (Coef. RAM) are separately provided.

FIG. 3 is a block diagram showing an example of the arrangement in which the arbitrary waveform generator and the coefficient generator have a waveform memory (DDS Wave RAM) and a coefficient memory (Coef. RAM) respectively.

The arbitrary waveform generator (DDS) 6 has a waveform memory (DDS Wave RAM) 61 operable to hold time-series data for producing a detection signal, and a DDS control part (DDSC) 60 including an address counter operable to perform the counting action by a timing signal supplied from the timer 10. The arbitrary waveform generator generates time-series data (data) by sequentially reading data from the waveform memory 61 according to an address (addr) supplied from the address counter in the DDS control part (DDSC) 60. The time-series data (dds_out) thus generated are converted into analog detection signals by the D/A converter 7, which are applied to the sensor node 1.

The window function generator 9 has a window function coefficient memory (Window RAM) 91 operable to hold a window function coefficient, and a window function generation control part (WndwGC) 90 including an address counter operable to perform the action of counting timing signals supplied from the timer 10; each coefficient value of the window function is sequentially read from the window function coefficient memory 91 according to an address (addr) supplied from the address counter in the window function generation control part 90 and supplied to the coefficient generator 8.

The coefficient generator 8 includes a coefficient memory (Coef. RAM) 81 operable to hold a Fourier coefficient, and a coefficient generation control part (CoefGC) 80 including an address counter for performing the action of counting timing signals supplied from the timer 10; each Fourier transform coefficient value (consisting of a real part data_real and an imaginary part data_img) is sequentially read from the coefficient memory 81 according to an address (addr) supplied from the address counter in the coefficient generation control part 80, multiplied by a window function coefficient supplied from the window function generator 9 in the coefficient generation control part 80, and supplied to the discrete Fourier transform device (DFT) 5.

It is also possible to omit the window function generator 9 by making an arrangement such that a value obtained by multiplying a Fourier transform coefficient value by a window function coefficient value in advance is stored in the coefficient memory 81. In this way, the circuit scale can be kept down at a small level.

While the embodiments where the waveform memory (DDS Wave RAM) 61, the coefficient memory (Coef. RAM) 81 and the window function coefficient memory (Window RAM) 91 are mounted as RAM have been described, they may be memories of another form, such as ROM. In addition, the touch sensing circuit 100 may be arranged so that it has only one memory, and the access to the memory can be performed in a time sharing manner. Further, an operational circuit may be mounted instead of the memory. This applies to the coefficient memories 82 to 84 in the description with reference to the other diagrams as well.

[Case (1) of Sharing a Coefficient Memory as a Waveform Memory]

In the example shown in FIG. 3, the waveform memory 61 and the coefficient memory 81 are provided respectively, and data to be stored in the coefficient memory 81 are values of a cosine (cos $\phi$) and a sine (sin $\phi$) corresponding to a phase ($\phi$) because they are Fourier coefficients. For instance, the cosine (cos $\phi$) corresponding to the phase ($\phi$) includes $\cos(0)$, $\cos(\pi/4)$, $\cos(\pi/2)$, $\cos(3\pi/4)$, $\cos(\pi)$, $\cos(5\pi/4)$, $\cos(3\pi/2)$, $\cos(7\pi/4)$, and $\cos(2\pi)$, and the sine (sin $\phi$) corresponding to the phase ($\phi$) includes $\sin(\phi)$, $\sin(\pi/4)$, $\sin(\pi/2)$, $\sin(3\pi/4)$, $\sin(\pi)$, $\sin(5\pi/4)$, $\sin(3\pi/2)$, $\sin(7\pi/4)$, and $\sin(2\pi)$. Therefore, the coefficient memory can be used as a waveform memory if detection signals generated by the arbitrary waveform generator (DDS) 6 are made sine waves or cosine waves, which are identical to each other in frequency.

Figure 4:
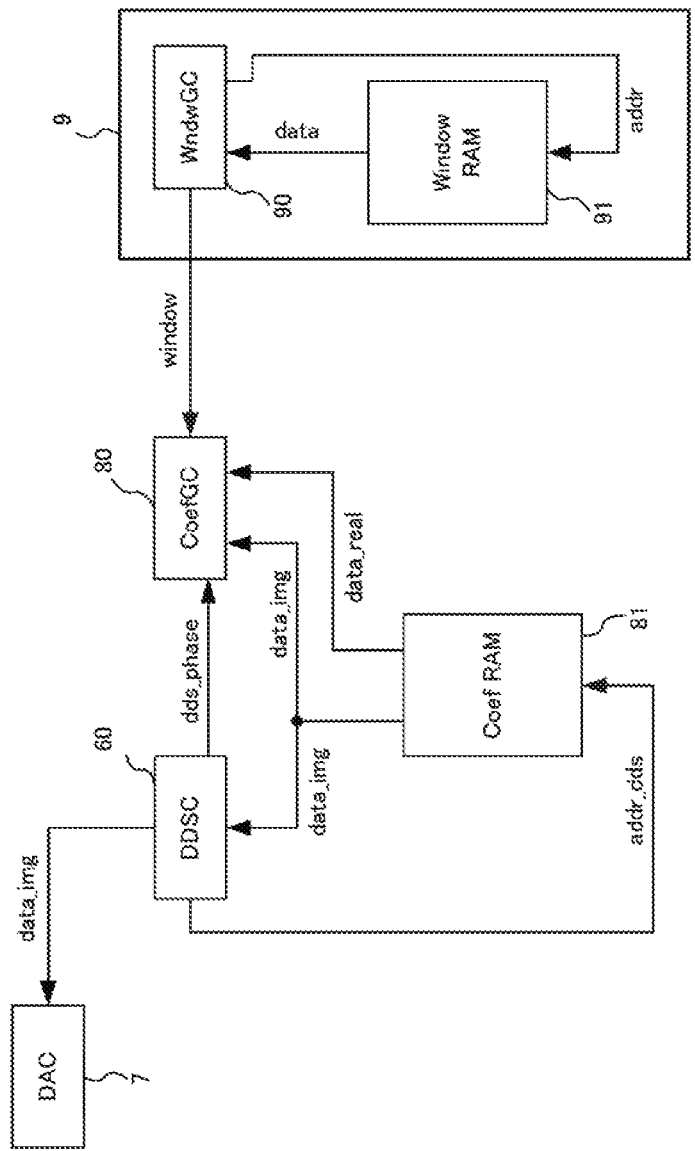
FIG. 4 is a block diagram showing an example of the first (commonly addressing) arrangement in which the coefficient memory (Coef. RAM) is shared by an arbitrary waveform generator (DDS) and a coefficient generator.

FIG. 4 is a block diagram showing an example of the first (commonly addressing) arrangement in which the coefficient memory (Coef. RAM) 81 is shared by the arbitrary waveform generator (DDS) 6 and the coefficient generator 8. Sharing the coefficient memory, the boundary between two blocks of the arbitrary waveform generator (DDS) 6 and the coefficient generator 8 becomes unclear. So, the block boundary is not shown in the diagram.

Each Fourier transform coefficient value (a real part data_real and an imaginary part data_img) is sequentially read from the coefficient memory 81 according to an address (addr) supplied from the address counter in the DDS control part (DDSC) 60, multiplied by a window function coefficient (window) supplied from the window function generator 9 in the coefficient generation control part 80, and supplied to the discrete Fourier transform device (DFT) 5. The imaginary part data_img of a Fourier transform coefficient value read from the coefficient memory 81 is the same as sine wave time-series data and as such, it is supplied through the DDS control part (DDSC) 60 to the D/A converter 7 and converted into an analog detection signal. The structure and action of the window function generator 9 are the same as those described with reference to FIG. 3 and therefore, their descriptions are skipped here.

Making arrangement so that the coefficient memory (Coef. RAM) 81 is shared by the arbitrary waveform generator (DDS) 6 and the coefficient generator 8 can eliminate the necessity for the waveform memory 61, whereby the circuit scale can be kept down at a small level.

Further, supplying a dds_phase signal which serves to transfer information about the phase of a detection signal from the DDS control part (DDSC) 60 to the coefficient generation control part 80 enables the further reduction in the storage capacity of the coefficient memory 81. In case that a value to be stored in the coefficient memory 81 is a sine (sin $\phi$) corresponding to a phase ($\phi$), the polarity of the coefficient value data_img in a period with the phase ranging from 0 to $\pi$ is inverted to that in a period ranging from $\pi$ to $2\pi$. The phase information is transferred by the dds_phase signal. So, using the coefficient generation control part 80 to control the polarity of the coefficient value data_img, the storage capacity of the coefficient memory 81 can be cut by half. A period with the phase ranging from 0 to $\pi/2$ and a period with the phase ranging from $\pi/2$ to $\pi$ are symmetric to each other in coefficient value with respect to the central phase value thereof. This also, applies to a combination of a period of $\pi$ to $3\pi/2$ and a period of $3\pi/2$ to $2\pi$. Taking advantage of this characteristic, the storage capacity of the coefficient memory 81 can be cut to ¼. This example will be described with reference to FIGS. 7 to 9 in the subsequent fourth embodiment in detail.

[Case (2) of Sharing a Coefficient Memory as a Waveform Memory]

Figure 5:
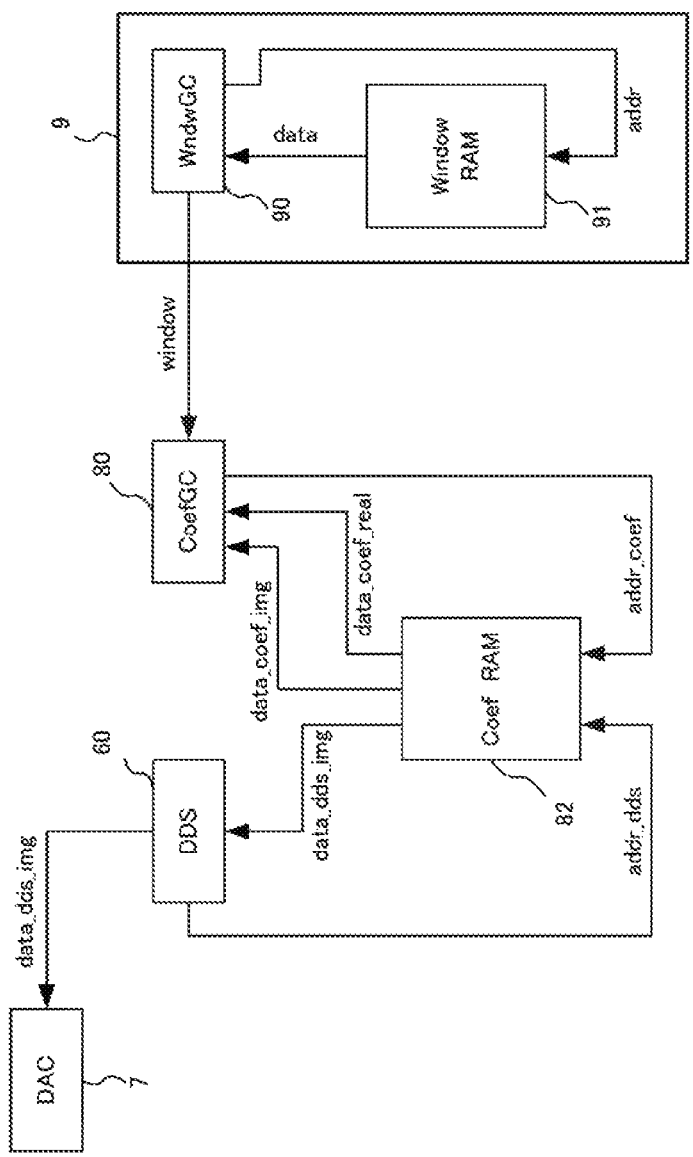
FIG. 5 is a block diagram showing an example of the second (separately addressing) arrangement in which the coefficient memory (Coef. RAM) is shared by the arbitrary waveform generator (DDS) and the coefficient generator.

FIG. 5 is a block diagram showing an example of the second (separately addressing) arrangement in which the coefficient memory (Coef. RAM) 82 is shared by the arbitrary waveform generator (DDS) 6 and the coefficient generator 8. Sharing the coefficient memory in the same way as in the example shown in FIG. 4, the boundary between two blocks of the arbitrary waveform generator (DDS) 6 and the coefficient generator 8 becomes unclear. So, the block boundary is not shown in the diagram.

Unlike the example of FIG. 4 where the coefficient memory 81 is accessed according to each address (addr) supplied from the address counter in the DDS control part (DDSC) 60, the coefficient memory 82 is accessed according to each of an address (addr_dds) supplied from the address counter in the DDS control part (DDSC) 60, and an address (addr_coef) supplied from the address counter in the coefficient generation control part 80 in the example of FIG. 5. The data to be stored in the coefficient memory 82 are the same as that to be stored in the coefficient memory 81 shown in FIG. 4 in itself. The data data_dds_img read according to addresses (addr_dds) on the side of the DDS control part (DDSC) 60 are supplied to the D/A converter 7, and converted into analog detection signals. The data data_coef_img and data_coef_real, which are read according to addresses (addr_coef) on the side of the coefficient generation control part 80, are multiplied by window function coefficients (window) supplied from window function generator 9 in the coefficient generation control part 80 and supplied to the discrete Fourier transform device (DFT) 5. The other structures and actions are the same as those in FIG. 4 and therefore, their descriptions are skipped here.

It is possible to produce detection signal time-series data data_dds_img and sequentially supplied Fourier coefficient values data_coef_img and data_coef_real in waveforms differing from each other in phase and/or frequency. For instance, the phase can be shifted by only $\pi/4$ by sequentially reading Fourier coefficient values data_coef_img from cos(0) with a phase of 0, and detection signal time-series data data_dds_img from cos($\pi/4$) with a phase of $\pi/4$ on the supposition that data to be stored in the coefficient memory 82 are cos(0), cos($\pi/4$), cos($\pi/2$), cos($3\pi/4$), cos($\pi$), cos($5\pi/4$), cos($3\pi/2$), cos($7\pi/4$) and cos($2\pi$). In addition, the frequencies can be changed by making the address counter in the DDS control part (DDSC) 60, and the address counter in the coefficient generation control part 80 different from each other in operational speed. If the address (addr_coef) on the side of the coefficient generation control part 80, namely the coefficient-side phase is made an integer multiple of the address (addr_dds) on the side of the DDS control part (DDSC) 60, namely the detection signal phase, a higher harmonic component of the basic frequency of a detection signal can be calculated in the discrete Fourier transform device (DFT) 5. Now, it is noted that the coefficient-side phase is not limited to the integer multiple, the relation between the coefficient-side phase (address addr_coef) and the detection signal-side phase (address addr_dds) can be provided appropriately.

The coefficient memory 82 can be mounted in the form of a double-port memory having two address ports as shown in FIG. 5. Also, the coefficient memory may be mounted in the form of a single-port memory to be accessed according to two addresses in a time sharing manner.

[Case (3) of Sharing a Coefficient Memory as a Waveform Memory]

Figure 6:
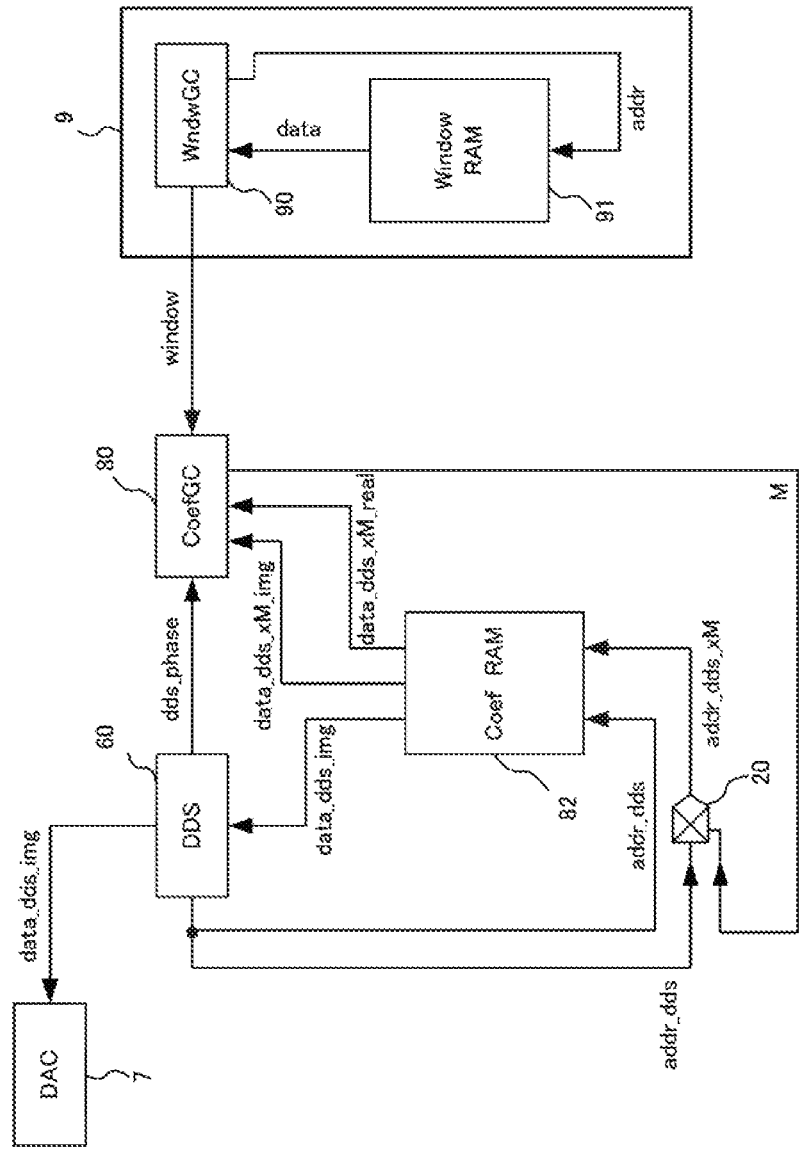
FIG. 6 is a block diagram showing an example of the third (separately addressing and harmonics supporting) arrangement in which the coefficient memory (Coef. RAM) is shared by the arbitrary waveform generator (DDS) and the coefficient generator.

FIG. 6 is a block diagram showing an example of the third (separately addressing and harmonics supporting) arrangement in which the coefficient memory (Coef. RAM) 82 is shared by the arbitrary waveform generator (DDS) 6 and the coefficient generator 8. Sharing the coefficient memory in the same as in the examples shown in FIGS. 4 and 5, the boundary between two blocks of the arbitrary waveform generator (DDS) 6 and the coefficient generator 8 becomes unclear. So, the block boundary is not shown in the diagram.

The difference thereof from the example of FIG. 5 is that the touch sensing circuit further includes a multiplier 20, and a value of a detection signal-side phase (address addr_dds) multiplied by an integer of M is input to the coefficient memory 82 as a coefficient-side phase (address addr_coef). The integer M is supplied from the coefficient generation control part 80. The data stored in the coefficient memory 82 are the same as those in the coefficient memory 81 of FIG. 5 in itself. The data data_dds_img read according to an address (addr_dds) on the side of the DDS control part (DDSC) 60 is supplied to the D/A converter 7, and converted into an analog detection signal there. On the coefficient generation side, data data_dds_xM_img and data_dds_xM_real, which are read according to an address addr_coef_xM resulting the multiplication by the integer M, are multiplied by a window function coefficient supplied from the window function generator 9 in the coefficient generation control part 80 and then, supplied to the discrete Fourier transform device (DFT) 5. The other structures and actions are the same as those in FIG. 5 and therefore, their descriptions are skipped here.

Thus, the discrete Fourier transform device (DFT) 5 can calculate higher harmonic components of the basic frequency of a detection signal even with smaller circuit scale.

[Fourth Embodiment] Storing Data of a Quarter Wavelength in the Coefficient Memory As described above, data to be stored in the coefficient memory can be reduced to a quarter of one cycle in consideration of its symmetry. Therefore, the storage capacity of the coefficient memory can be reduced to a quarter of that required for storing a whole cycle.

[¼ Cosine RAM]

Figure 7:
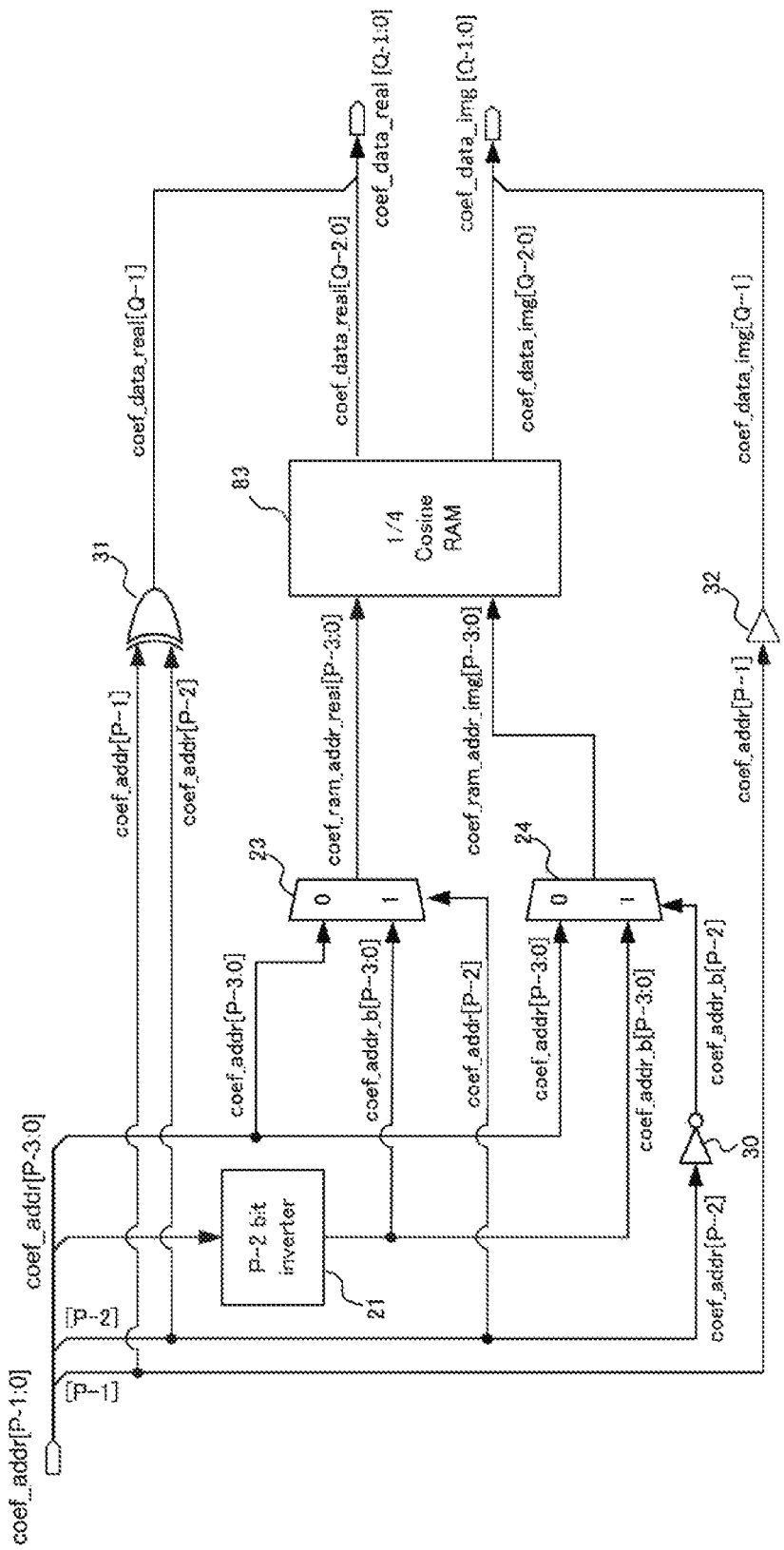
FIG. 7 is a block diagram showing an example of the arrangement of the coefficient generator 8 arranged so that the coefficient memory (Coef. RAM) stores quarter wavelength cosine wave data.

FIG. 7 is a block diagram showing an example of the arrangement of the coefficient generator 8 arranged so that the coefficient memory (Coef. RAM) 83 stores quarter wavelength cosine wave data. Specifically, the coefficient memory 83 is "¼ Cosine RAM", in which of cosines (cos $\phi$), data of a phase range of $0 \leq \phi 0 < \pi/2$ are stored.

On acceptance of input of each coefficient address coef_addr[P−1:0] which is a P-bit address value, the coefficient generator 8 accesses the coefficient memory (Coef. RAM) 83 to read data therefrom, and outputs a real part coef_data_real[Q−1:0] and an imaginary part coef_data_img[Q−1:0] of Q-bit coefficient data (P and Q are each a natural number).

The coefficient generator 8 includes the coefficient memory 83, a P−2 bit inverter 21, two selectors 23 and 24, an inverter 30, an XOR gate 31, and a buffer 32.

The coefficient address coef_addr[P−1:0] is a P-bit address value; the coef_addr[P−1] is the most significant bit, and the coef_addr[P−2] is a bit subsequent to the most significant bit. The coefficient address coef_addr[P−1:0] corresponds to a phase range of $0 \leq \phi < 2\pi$ on the whole, in which coef_addr[P−1:P−2]=0x00 in the phase range of $0 \leq \phi 0 < \pi/2$; coef_addr[P−1:P−2]=0x01 in the range of $\pi/2 \leq \phi 1 < \pi$; coef_addr[P−1:P−2]=0x10 in the range of $\pi \leq \phi 2 < 3\pi/2$; and coef_addr[P−1:P−2]=0x11 in the range of $3\pi/2 \leq \phi 3 < 2\pi$. Here, the notation "[x:y]" represents binary numbers of x−y+1 bits ranging from the y-th bit to the x-th bit. A binary number having "0x" at its head denotes the value of a binary number of the bit number.

The P−2 bit inverter 21 inverts all of P−2 bits (coef_addr [P−3:0]) of the coefficient address except the most significant 2 bits, and outputs coef_addr_b[P−3:0]. The inverter 30 inverts the second high-order bit coef_addr[P−2] of the coefficient address and outputs coef_addr_b[P−2]. The XOR gate 31 takes the exclusive-OR of the most significant 2 bits, i.e. coef_addr[P−1] and coef_addr[P−2] of the coefficient address, and outputs it as the most significant bit coef_data_real[Q−1] of the real part of coefficient data. The buffer 32 outputs the most significant bit coef_addr[P−1] of the coefficient address as the most significant bit coef_data_img [Q−1] of the imaginary part of the coefficient data as it is.

In the phase range of $0 \leq \phi 0 < \pi/2$, the real part is cos $\phi 0 = \cos(\phi 0)$. Therefore, the selector 23 selects the side of coef_addr[P−2]=0x0, and outputs the address coef_addr[P−3:0] subjected to no bit inversion as an address coef_ram_addr_real[P−3:0] for the real part; the most significant bit coef_data_real[Q−1]=0x0 is added to the read data coef_data_real[Q−2:0]; and a coefficient value coef_data_real[Q−1:0] is output with its value remaining positive. On the other hand, the imaginary part is sin $\phi 0 = \cos(-\phi 0)$ and therefore, the selector 24 selects the side of coef_addr_b[P−2]=0x1, and outputs the address coef_addr_b[P−3:0] subjected to bit inversion as an address coef_ram_addr_img[P−3:0] for the imaginary part; the most significant bit coef_data_img[Q−1]=0x1 is added to the read data coef_data_img[Q−2:0]; and a coefficient value coef_data_img[Q−1:0] is output with its value remaining positive.

In the phase range of $\pi/2 \leq \phi 1 < \pi$, the real part is cos $\phi 1 = -\cos(-\phi 0)$. Therefore, the selector 23 selects the side of coef_addr[P−2]=0x1, and outputs the address coef_addr_b [P−3:0] subjected to bit inversion as an address coef_ram_addr_real[P−3:0] for the real part; and the most significant bit coef_data_real[Q−1]=0x1 is added to the read data coef_data_real[Q−2:0], followed by conversion to a negative value. Then, a coefficient value coef_data_real[Q−1:0] is output. Further, the imaginary part is sin $\phi 1 = \cos(\phi 0)$. Therefore, the selector 24 selects the side of coef_addr_b [P−2]=0x0 and outputs the address coef_addr[P−3:0] subjected to no bit inversion as an address coef_ram_addr_img [P−3:0] for the imaginary part; the most significant bit coef_data_img[Q−1]=0x0 is added to the read data coef_data_img[Q−2:0]; and a coefficient value coef_data_img[Q−1:0] is output with its value remaining positive.

In the phase range of $\pi \leq \phi 2 < 3\pi/2$, the real part is cos $\phi 2 = -\cos(\phi 0)$. Therefore, the selector 23 selects the side of coef_addr[P−2]=0x0 and outputs the address coef_addr[P−3:0] subjected to no bit inversion as an address coef_ram_addr_real[P−3:0] for the real part; and the most significant bit coef_data_real[Q−1]=0x1 is added to the read data coef_data_real[Q−2:0], followed by conversion to a negative value. Then, a coefficient value coef_data_real[Q−1:0] is output. Further, the imaginary part is sin $\phi 2 = -\cos(-\phi 0)$. Therefore, the selector 24 selects the side of coef_addr_b[P−2]=0x1, and outputs the address coef_addr_b[P−3:0] subjected to bit inversion as an address coef_ram_addr_img[P−3:0] for the imaginary part; and the most significant bit coef_data_img [Q−1]=0x1 is added to the read data coef_data_img[Q−2:0], followed by conversion to a negative value. Then, a coefficient value coef_data_img[Q−1:0] is output.

In the phase range of $3\pi/2 \leq \phi 3 < 2\pi$, the real part is cos $\phi 3 = \cos(-\phi 0)$. Therefore, the selector 23 selects the side of coef_addr[P−2]=0x1, and outputs the address coef_addr_b [P−3:0] subjected to bit inversion as an address coef_ram_addr_real[P−3:0] for the real part; and the most significant bit coef_data_real[Q−1]=0x0 is added to the read data coef_data_real[Q−2:0]. Thus a coefficient value coef_data_real[Q−1:0] is output with its value remaining positive. Further, the imaginary part is sin $\phi 3 = -\cos(\phi 0)$. Therefore, the selector 24 selects the side of coef_addr_b [P−2]=0x0, and outputs the address coef_addr[P−3:0] subjected to no bit inversion as an address coef_ram_addr_img [P−3:0] for the imaginary part. The most significant bit coef_data_img[Q−1]=0x1 is added to the read data coef_data_img[Q−2:0], followed by conversion to a negative value. Then, a coefficient value coef_data_img[Q−1:0] is output.

Since the symmetry of Fourier coefficient data is taken into account as described above, the storage capacity of the coefficient memory can be reduced to a quarter of that when a whole cycle is stored.

[¼ Sine RAM]

The coefficient memory may be replaced with one which stores sine wave data instead of cosine wave data.

Figure 8:
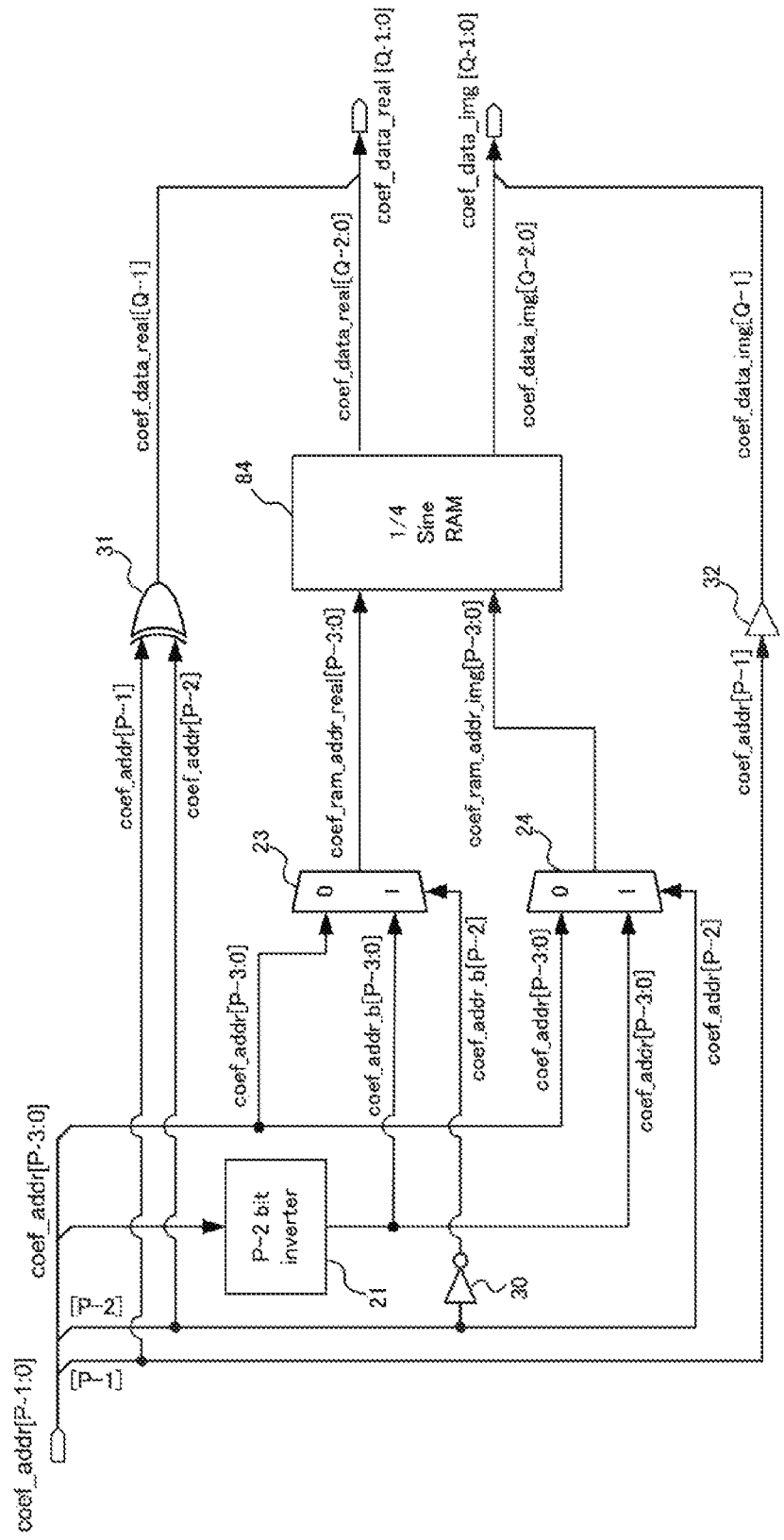
FIG. 8 is a block diagram showing an example of the arrangement of the coefficient generator 8 arranged so that the coefficient memory (Coef. RAM) stores quarter wavelength sine wave data.

FIG. 8 is a block diagram showing an example of the arrangement of the coefficient generator 8 arranged so that the coefficient memory (Coef. RAM) 84 stores quarter wavelength sine wave data. Specifically, the coefficient memory 84 is "¼ Sine RAM", in which of sines (sin $\phi$), data of a phase range of $0 \leq \phi 0 < \pi/2$ are stored.

On acceptance of input of each coefficient address coef_addr[P−1:0] which is a P-bit address value, the coefficient generator 8 accesses the coefficient memory (Coef. RAM) 84 to read data therefrom, and outputs a real part coef_data_real[Q−1:0] and an imaginary part coef_data_img[Q−1:0] of Q-bit coefficient data.

The coefficient generator 8 includes the coefficient memory 84, a P−2 bit inverter 21, two selectors 23 and 24, an inverter 30, an XOR gate 31, and a buffer 32.

The P−2 bit inverter 21 inverts all of P−2 bits (coef_addr [P−3:0]) of a coefficient address except the most significant 2 bits thereof, and outputs coef_addr_b[P−3:0]. The inverter 30 inverts the second high-order bit coef_addr[P−2] of the coefficient address, and outputs coef_addr_b[P−2]. The XOR gate 31 takes the exclusive-OR of the most significant 2 bits, i.e. coef_addr[P−1] and coef_addr[P−2] of the coefficient address, and outputs it as the most significant bit coef_data_real[Q−1] of the real part of coefficient data. The buffer 32 outputs the most significant bit coef_addr[P−1] of the coefficient address as the most significant bit coef_data_img[Q−1] of the imaginary part of the coefficient data as it is.

In the phase range of $0 \leq \phi 0 < \pi/2$, the real part is cos $\phi 0 = \sin(-\phi 0)$. Therefore, the selector 23 selects the side of coef_addr_b[P−2]=0x1, and outputs the address coef_addr_b[P−3:0] subjected to bit inversion as an address coef_ram_addr_real[P−3:0] for the real part; the most significant bit coef_data_real[Q−1]=0x0 is added to the read data coef_data_real[Q−2:0]; and a coefficient value coef_data_real[Q−1:0] is output with its value remaining positive. On the other hand, the imaginary part is sin $\phi 0 = \sin(\phi 0)$ and therefore, the selector 24 selects the side of coef_addr[P−2]=0x0, and outputs the address coef_addr[P−3:0] subjected to no bit inversion as an address coef_ram_addr_img[P−3:0] for the imaginary part; the most significant bit coef_data_img[Q−

1]=0x0 is added to the read data coef_data_img[Q-2:0]; and a coefficient value coef_data_img[Q-1:0] is output with its value remaining positive.

In the phase range of $\pi/2 \leq \phi1 < \pi$, the real part is cos $\phi1=-\sin(\phi0)$. Therefore, the selector 23 selects the side of coef_addr_b[P-2]=0x0, and outputs the address coef_addr [P-3:0] subjected to no bit inversion as an address coef_ram_addr_real[P-3:0] for the real part; and the most significant bit coef_data_real[Q-1]=0x1 is added to the read data coef_data_real[Q-2:0], followed by conversion to a negative value. Then, a coefficient value coef_data_real[Q-1:0] is output. Further, the imaginary part is sin $\phi1=\sin(-\phi0)$. Therefore, the selector 24 selects the side of coef_addr[P-2]=0x1, and outputs the address coef_addr_b[P-3:0] subjected to bit inversion as an address coef_ram_addr_img[P-3:0] for the imaginary part; the most significant bit coef_data_img[Q-1]=0x0 is added to the read data coef_data_img[Q-2:0]; and a coefficient value coef_data_img[Q-1:0] is output as its value remaining positive.

In the phase range of $\pi \leq \phi2 < 3\pi/2$, the real part is cos $\phi2=-\sin(-\phi0)$. Therefore, the selector 23 selects the side of coef_addr_b[P-2]=0x1, and outputs the address coef_addr_b[P-3:0] subjected to bit inversion as an address coef_ram_addr_real[P-3:0] for the real part; and the most significant bit coef_data_real[Q-1]=0x1 is added to the read data coef_data_real[Q-2:0], followed by conversion to a negative value. Then, a coefficient value coef_data_real[Q-1:0] is output. Further, the imaginary part is sin $\phi2=-\sin(\phi0)$. Therefore, the selector 24 selects the side of coef_addr[P-2]=0x0, and outputs the address coef_addr[P-3:0] subjected to no bit inversion as an address coef_ram_addr_img[P-3:0] for the imaginary part; and the most significant bit coef_data_img[Q-1]=0x1 is added to the read data coef_data_img[Q-2:0], followed by conversion to a negative value. Then, a coefficient value coef_data_img[Q-1:0] is output.

In the phase range of $3\pi/2 \leq \phi3 < 2\pi$, the real part is cos $\phi3=\sin(\phi0)$. Therefore, the selector 23 selects the side of coef_addr_b[P-2]=0x0, and outputs the address coef_addr [P-3:0] subjected to no bit inversion as an address coef_ram_addr_real[P-3:0] for the real part; the most significant bit coef_data_real[Q-1]=0x0 is added to the read data coef_data_real[Q-2:0]; and a coefficient value coef_data_real[Q-1:0] is output with its value remaining positive. Further, the imaginary part is sin $\phi3=-\sin(-\phi0)$. Therefore, the selector 24 selects the side of coef_addr[P-2]=0x1, and outputs the address coef_addr_b[P-3:0] subjected to bit inversion as an address coef_ram_addr_img[P-3:0] for the imaginary part; and the most significant bit coef_data_img[Q-1]=0x1 is added to the read data coef_data_img[Q-2:0], followed by conversion to a negative value. Then, a coefficient value coef_data_img[Q-1:0] is output.

Since the symmetry of Fourier coefficient data is taken into account as described above, the storage capacity of the coefficient memory can be reduced to a quarter of that when a whole cycle is stored even in the case of using, as the coefficient memory, a ¼ Sine RAM capable of storing quarter wavelength sine wave data.

[Sharing a ¼ Sine RAM as a Waveform RAM for DDS]

Also in the case of sharing a coefficient memory as a waveform memory, which has been described concerning the third embodiment, the storage capacity of the shared coefficient memory can be reduced to a quarter of that for storing a whole cycle. Now, a form composed of a combination of the arrangement as described with reference to FIG. 5, which allows the relation between a coefficient-side address addr_coef and a detection signal-side address addr_dds to be provided appropriately, and the arrangement as described with reference to FIG. 8, in which a coefficient memory (Coef. RAM) 84 stores data of quarter wavelength sine waves will be described as an example, what is described here applies to other combinations as well.

Figure 9:
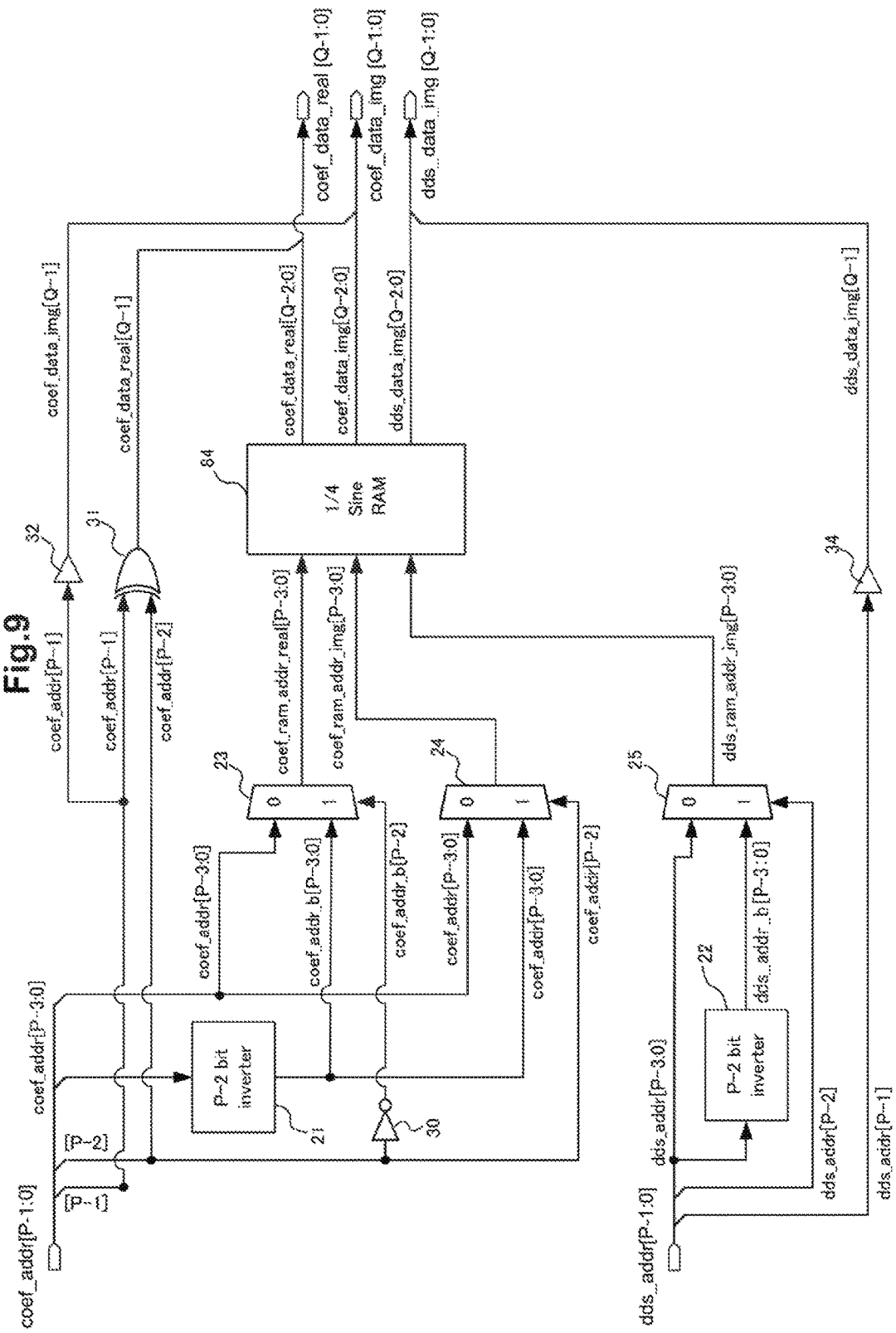
FIG. 9 is a block diagram showing an example of the arrangement in which the coefficient memory (Coef. RAM) stores quarter wavelength sine wave data, and separate addresses are used for the arbitrary waveform generator and the coefficient generator respectively.

FIG. 9 is a block diagram showing an example of the arrangement in which the coefficient memory (Coef. RAM) stores quarter wavelength sine wave data, and separate addresses are used for the arbitrary waveform generator and the coefficient generator respectively. The coefficient generator of FIG. 9 is arranged by adding a P-2 bit inverter 22, a selector 25 and a buffer 34 to the structure of the coefficient generator 8 shown in FIG. 8, and the part of it overlaps the coefficient generator 8 shown in FIG. 8 in structure. Therefore, the part is also the same, in action, as the corresponding part of the coefficient generator of FIG. 8, and the description thereof is skipped here.

On acceptance of input of an added detection signal-side P-bit address dds_addr[P-1:0], the coefficient generator accesses the coefficient memory (Coef. RAM) 84 to read data, and outputs Q-bit detection signal-side data dds_data_img[Q-1:0]. The description is presented on the supposition that the detection signal-side data dds_data_img [Q-1:0] at this time are sine waves.

The P-2 bit inverter 22 inverts all of P-2 bits (dds_addr [P-3:0]) of the detection signal-side address except the most significant 2 bits, and outputs dds_addr_b[P-3:0]. The inverter 33 inverts the second high-order bit dds_addr[P-2] of the detection signal-side address, and outputs dds_addr_b [P-2]. The buffer 34 outputs the most significant bit dds_addr[P-1] of the detection signal-side address as the most significant bit dds_data_img[Q-1] of detection signal-side data as it is.

In the phase range of $0 \leq \phi0 < \pi/2$, sin $\phi0=\sin(\phi0)$. Therefore, the selector 25 selects the side of dds_addr[P-2]=0x0, and outputs the address dds_addr[P-3:0] subjected to no bit inversion as an address dds_ram_addr_img[P-3:0]; the most significant bit dds_data_img[Q-1]=0x0 is added to the read data dds_data_img[Q-2:0]; and detection signal-side data dds_data_img[Q-1:0] is output with its value remaining positive.

In the phase range of $\pi/2 \leq \phi1 < \pi$, sin $\phi1=\sin(-\phi0)$. Therefore, the selector 25 selects the side of dds_addr[P-2]=0x1, and outputs the address dds_addr_b[P-3:0] subjected to bit inversion as an address dds_ram_addr_img[P-3:0]; the most significant bit dds_data_img[Q-1]=0x0 is added to the read data dds_data_img[Q-2:0]; and detection signal-side data dds_data_img[Q-1:0] is output with its value remaining positive.

In the phase range of $\pi \leq \phi2 < 3\pi/2$, sin $\phi2=-\sin(\phi0)$. Therefore, the selector 25 selects the side of dds_addr[P-2]=0x0, and outputs the address dds_addr[P-3:0] subjected to no bit inversion as an address dds_ram_addr_img[P-3:0]; and the most significant bit dds_data_img[Q-1]=0x1 is added to the read data dds_data_img[Q-2:0], followed by conversion to a negative value. Then, detection signal-side data dds_data_img[Q-1:0] is output.

In the phase range of $3\pi/2 \leq \phi3 < 2\pi$, sin $\phi3=-\sin(-\phi0)$. Therefore, the selector 25 selects the side of dds_addr[P-2]=0x1, and outputs the address dds_addr_b[P-3:0] subjected to bit inversion as an address dds_ram_addr_img[P-3:0]; and the most significant bit dds_data_img[Q-1]=0x1 is added to the read data dds_data_img[Q-2:0], followed by conversion to a negative value. Then, detection signal-side data dds_data_img[Q-1:0] is output.

As described above, the storage capacity of the shared coefficient memory can be reduced to a quarter of that for storing a whole cycle even in the case of sharing the coefficient memory as a waveform memory.

[Fourth Embodiment] 1-Bit SDM

The circuit scale of the discrete Fourier transform device (DFT) 5 can be suppressed by the sigma-delta modulator (SDM) 4 of one bit.

Figure 10:
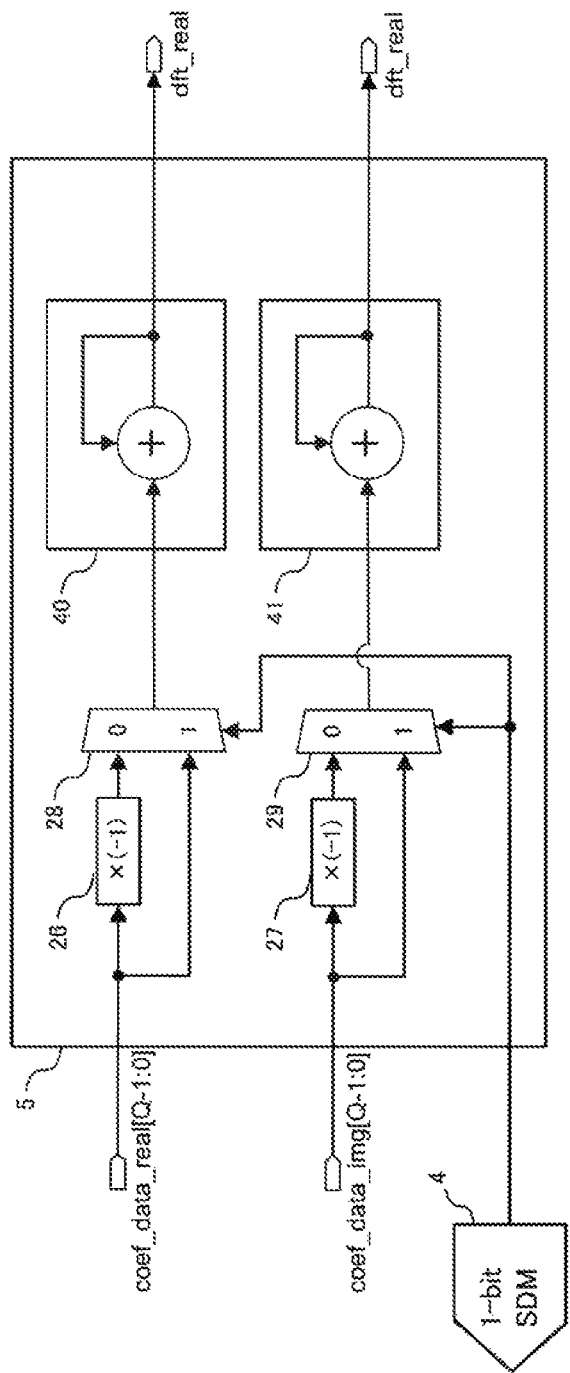
FIG. 10 is a block diagram showing an example of arrangement of a discrete Fourier transform device according to the fourth embodiment.

FIG. 10 is a block diagram showing an example of the arrangement of the discrete Fourier transform device (DFT) 5 according to the fourth embodiment. The discrete Fourier transform device (DFT) 5 accepts the input of 1-bit signals corresponding to response signals, which come from the 1-bit sigma-delta modulator (SDM) 4, and a discrete Fourier transform basis function sequence consisting of real parts coef_data_real[Q−1:0] and imaginary parts coef_data_img [Q−1:0], which are supplied from the coefficient generator 8, and outputs real parts dft_real and imaginary parts dft_img, which are results of the transformation. The discrete Fourier transform device (DFT) 5 has polarity-inverting circuits 26 and 27, selectors 28 and 29, and accumulators 40 and 41 for real parts and imaginary parts respectively.

The 1-bit signals corresponding to response signals input from the sigma-delta modulator (SDM) 4 make a time-series signal sequence, representing +1 or −1. The discrete Fourier transform device performs, by the accumulators 40 and 41, the accumulation of the basis function sequence, as it is without being subjected to sign inversion with the 1-bit signal representing one (1), or after having been subjected to sign inversion with the 1-bit signal representing zero (0), and outputs a real part dft_real and an imaginary part dft_img as a result of the transformation after a predetermined number of accumulations.

Figure 11:
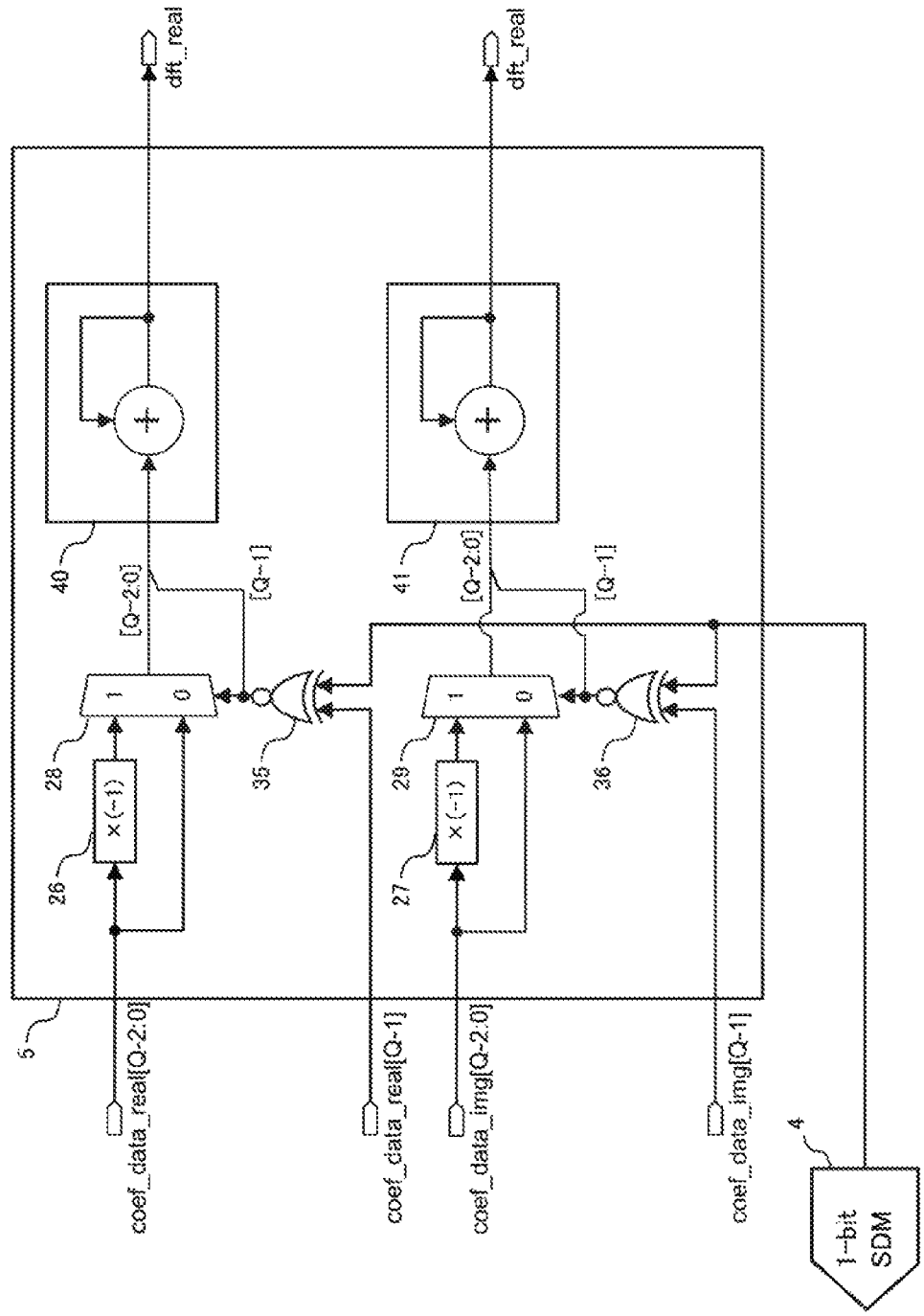
FIG. 11 is a block diagram showing another example of the arrangement of the discrete Fourier transform device according to the fourth embodiment.

FIG. 11 is a block diagram showing another example of the arrangement of the discrete Fourier transform device (DFT) 5 of the fourth embodiment. The discrete Fourier transform device (DFT) 5 further includes exclusive logic NOR gates 35 and 36 for the real and imaginary parts respectively. The coefficient generator 8 according to the third embodiment, which has been described with reference to FIGS. 7 to 9 outputs an orthogonal function sequence in such a way that its sign and the other part are separated. Specifically, the following are output from each of the coefficient memories 83 and 84 of which the storage capacity is reduced to a quarter cycle: bits of a cosine (cosine) function sequence except its sign bit as coef_data_real[Q−2:0]; bits of a sine (sine) function sequence except its sign bit as coef_data_img[Q−2:0]; and the respective sign bits coef_data_real[Q−1] and coef_data_img[Q−1]. While the respective diagrams are drawn as if the bits are all the same, it is obvious that the different circuits output them.

The discrete Fourier transform device (DFT) 5 shown in FIG. 11 is satisfactory in the matching with the coefficient generator 8 like this. The exclusive logic NORs of a 1-bit signal corresponding to a response signal, which is input from the sigma-delta modulator (SDM) 4, and sign bits coef_data_real[Q−1] and coef_data_img[Q−1] of an orthogonal function sequence input from the coefficient generator 8 are determined by the corresponding exclusive NOR gates 35 and 36 respectively. The results represent the respective polarities of the real and imaginary parts of the product of the response signal and the orthogonal function sequence respectively. It is zero (0) in the case of being positive, and one (1) in the case of being negative because of determining the exclusive logic NOR. If the result is 1 (the product of the response signal and the orthogonal function sequence is negative), the orthogonal function sequence coef_data_real[Q−1:0] and the coef_data_img[Q−1:0] are inverted in polarity. If it is 0 (the result of the response signal and the orthogonal function sequence is positive), they are not inverted. Then, the resultant orthogonal function sequence coef_data_real[Q−1:0] and coef_data_img[Q−1:0] are accumulated by the accumulators 40 and 41. After a predetermined number of accumulations, the resultant real part dft_real and imaginary part dft_img are output therefrom.

The numerical notation and the circuit configuration corresponding thereto are arbitrary. The orthogonal function sequences input from the coefficient generators 8 of FIGS. 7 to 9 are each represented in e.g. the form of an absolute value with a sign. Therefore, in case that the polarity-inverting circuits 26 and 27 of FIG. 11 are full-bit inverting circuits, and the product of the response signal and the orthogonal function sequence is negative, all of other bits (coef_data_real[Q−2:0] and coef_data_img[Q−2:0]) of a orthogonal function sequence except sign bits are inverted, and input to the accumulators 40 and 41 with the sign bits added thereto respectively. Thus, the accumulators 40 and 41 perform the addition in the notation of the complement of one (1).

The discrete Fourier transform device may be arranged to include exclusive logics OR gates instead of the exclusive logics NOR; the connection of the selectors 28 and 29 is changed therein.

In not only this embodiment, but also all the embodiments, RMS (Root Mean Square), i.e. the square root of the sum of respective squares of a real part dft_real and an imaginary part dft_img, which result from the transform by the discrete Fourier transform device (DFT) 5 may be calculated, and output as an amplitude component as a result of the transformation. In this time, the means square without calculating the root may be output as a square of an amplitude component. The discrete Fourier transform device arranged to output an amplitude component or an amplitude component square corresponding thereto can be diverted for a touch coordinate-calculating circuit which is connected to a conventional type touch sensing circuit operable to measure a change at a sensor node in a time domain without performing Fourier transform or the like, or a touch coordinate-calculating program directly or after making just a slight change.

While the disclosure has been concretely described above based on the embodiments, it is not limited to the embodiments. That is, various changes or modifications may be made without departing from the subject matter thereof.

For instance, the block divisions shown in the block diagrams are just examples. It is possible to perform such a change or modification that an additional block is arranged to materialize part or all of the function of a block in complete harmony with the function of another block. In addition, it is possible to materialize part of the function by a software process by e.g. the microcontroller 11 of the later stage.

What is claimed is:
1. A touch sensing circuit comprising:
   a Fourier coefficient generator comprising circuitry configured to:
   access, using a timing signal, a coefficient sequence from a coefficient table, wherein the coefficient sequence comprises a plurality of coefficient values each comprising a real part and an imaginary part; and
   generate Fourier coefficients based on the plurality of coefficient values multiplied by window function coefficient values;

a detection signal generator comprising circuitry configured to generate, using the timing signal and the coefficient sequence, a detection signal having a detection frequency;
an analog-to-digital converter (ADC) comprising circuitry configured to:
acquire, with a predetermined periodicity, samples of a response signal from a first sensor electrode coupled with the ADC, the response signal being responsive to applying the detection signal to one of: the first sensor electrode, and a second sensor electrode capacitively coupled with the first sensor electrode; and
output time-series response data using the acquired samples; and
a Fourier transform device comprising circuitry configured to output, using the time-series response data and the Fourier coefficients, a transformation result at the detection frequency.

2. The touch sensing circuit according to claim 1, further comprising:
a timer configured to generate the timing signal,
wherein the detection signal generator comprises:
an arbitrary waveform generator configured to, using the timing signal and the coefficient sequence, generate time-series waveform data; and
a digital-to-analog converter (DAC) comprising circuitry configured to generate the detection signal using the time-series waveform data.

3. The touch sensing circuit according to claim 2, further comprising a window function generator,
wherein the timer supplies the timing signal to the window function generator, and
wherein the window function generator supplies the window function coefficient values to the Fourier coefficient generator based on the timing signal.

4. The touch sensing circuit according to claim 2,
wherein the ADC is a 1-bit sigma-delta modulation circuit, and
wherein the Fourier transform device is further configured to:
invert one or more of the Fourier coefficients according to an exclusive OR operation on a sign bit of each of the Fourier coefficients and an output from the sigma-delta modulation circuit; and
after inverting the one or more of the Fourier coefficients, sum the Fourier coefficients to calculate an amplitude value at the detection frequency.

5. The touch sensing circuit according to claim 1, wherein the coefficient table holds a data sequence of a quarter cycle of a sine or cosine wave as the coefficient sequence.

6. The touch sensing circuit according to claim 1, further comprising:
a timer configured to generate the timing signal,
wherein the detection signal generator comprises:
an arbitrary waveform generator having a waveform table, wherein the arbitrary waveform generator is configured to:
using the timing signal, sequentially read time-series data from the waveform table; and
sequentially supply the time-series data; and
a digital-to-analog converter (DAC) configured to generate the detection signal using the sequentially supplied time-series data.

7. The touch sensing circuit according to claim 6, wherein the waveform table holds time-series data of a quarter cycle of the detection signal, and
wherein the coefficient table holds a data sequence of a quarter cycle of a sine or cosine wave as the coefficient sequence.

8. The touch sensing circuit according to claim 7, further comprising:
a window function generator configured to:
receive the timing signal; and
supply, based on the timing signal, the window function coefficient values to the Fourier coefficient generator.

9. The touch sensing circuit according to claim 1, wherein the ADC is a sigma-delta type ADC.

10. An input device comprising:
a plurality of sensor electrodes; and
a touch sensing circuit coupled with at least a first sensor electrode of the plurality of sensor electrodes, the touch sensing circuit comprising:
a Fourier coefficient generator configured to:
access, using a timing signal, a coefficient sequence from a coefficient table, wherein the coefficient sequence comprises a plurality of coefficient values each comprising a real part and an imaginary part; and
generate Fourier coefficients using the plurality of coefficient values multiplied by window function coefficient values;
a detection signal generator configured to generate, using the timing signal and the coefficient sequence, a detection signal having a detection frequency;
an analog-to-digital converter (ADC) configured to:
acquire, with a predetermined periodicity, samples of a response signal from the first sensor electrode, the response signal being responsive to applying the detection signal to one of: the first sensor electrode, and a second sensor electrode of the plurality of sensor electrodes that is capacitively coupled with the first sensor electrode; and
output time-series response data using the acquired samples; and
a Fourier transform device configured to output, using the time-series response data and the Fourier coefficients, a transformation result at the detection frequency.

11. The input device according to claim 10, wherein the touch sensing circuit further comprises:
a timer configured to generate the timing signal,
wherein the detection signal generator comprises:
an arbitrary waveform generator configured to, using the timing signal and the coefficient sequence, generate time-series waveform data; and
a digital-to-analog converter (DAC) configured to generate the detection signal using the time-series waveform data.

12. The input device according to claim 11,
wherein the ADC is a 1-bit sigma-delta modulation circuit, and
wherein the Fourier transform device is further configured to:
invert one or more of the Fourier coefficients according to an exclusive OR operation on a sign bit of each of the Fourier coefficients and an output from the sigma-delta modulation circuit; and
after inverting the one or more of the Fourier coefficients, sum the Fourier coefficients to calculate an amplitude value at the detection frequency.

13. The input device according to claim 10, wherein the coefficient table holds a data sequence of a quarter cycle of a sine or cosine wave as the coefficient sequence.

14. The input device according to claim 10, wherein the touch sensing circuit further comprises:
a window function generator configured to:
receive the timing signal; and
supply, based on the timing signal, the window function coefficient values to the Fourier coefficient generator.

15. The input device according to claim 10, wherein the touch sensing circuit further comprises:
a timer configured to generate the timing signal,
wherein the detection signal generator comprises:
an arbitrary waveform generator having a waveform table, wherein the arbitrary waveform generator is configured to:
using the timing signal, sequentially read time-series data from the waveform table; and
sequentially supply the time-series data; and
a digital-to-analog converter (DAC) configured to generate the detection signal using the sequentially supplied time-series data.

16. The input device according to claim 15, wherein the waveform table holds time-series data of a quarter cycle of the detection signal, and
wherein the coefficient table holds a data sequence of a quarter cycle of a sine or cosine wave as the coefficient sequence.

17. The input device according to claim 16, wherein the touch sensing circuit further comprises:
a window function generator configured to:
receive the timing signal; and
supply, based on the timing signal, the window function coefficient values to the Fourier coefficient generator.

18. The input device according to claim 10, wherein the ADC is a sigma-delta type ADC.

19. A method for use with a touch sensing circuit coupled with at least a first sensor electrode, the method comprising:
generating a timing signal;
determining a coefficient sequence using the timing signal, wherein the coefficient sequence comprises a plurality of coefficient values each comprising a real part and an imaginary part;
generating Fourier coefficients based on the plurality of coefficient values multiplied by window function coefficient values;
generating, using the timing signal and the coefficient sequence, a detection signal having a detection frequency;
responsive to applying the detection signal to one of (i) the first sensor electrode and (ii) a second sensor electrode capacitively coupled with the first sensor electrode, acquiring samples of a response signal from the first sensor electrode;
generating time-series response data using the acquired samples; and
outputting, using the time-series response data and the Fourier coefficients, a transformation result at the detection frequency.

20. The method of claim 19, wherein generating the detection signal comprises:
receiving the timing signal and the coefficient sequence at an arbitrary waveform generator of the touch sensing circuit;
generating, using the arbitrary waveform generator, time-series waveform data; and
generating the detection signal using the time-series waveform data.

* * * * *